US008558308B1

(12) United States Patent
Blank et al.

(10) Patent No.: US 8,558,308 B1
(45) Date of Patent: Oct. 15, 2013

(54) METHOD OF MANUFACTURING A SEMICONDUCTOR DEVICE USING A CONTACT IMPLANT AND A METALLIC RECOMBINATION ELEMENT AND SEMICONDUCTOR

(75) Inventors: Oliver Blank, Villach (AT); Michael Hutzler, Villach (AT); David Laforet, Villach (AT); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/517,658

(22) Filed: Jun. 14, 2012

(51) Int. Cl.
*H01L 29/66* (2006.01)

(52) U.S. Cl.
USPC .... 257/335; 257/339; 257/342; 257/E29.262; 257/E21.141; 438/270; 438/558

(58) Field of Classification Search
USPC ............... 438/270, 558; 257/335, 339, 342, 257/E29.262, E21.141
See application file for complete search history.

(56) References Cited

U.S. PATENT DOCUMENTS

| 5,528,058 A * | 6/1996 | Pike et al. ............... 257/142 |
| 7,087,981 B2 * | 8/2006 | Kapels et al. ........... 257/610 |
| 8,022,472 B2 * | 9/2011 | Yagi et al. .............. 257/330 |
| 8,120,074 B2 * | 2/2012 | Schulze et al. ......... 257/288 |
| 8,188,484 B2 * | 5/2012 | Nakano ................... 257/77 |
| 2012/0161231 A1* | 6/2012 | Tamaki et al. .......... 257/335 |

* cited by examiner

*Primary Examiner* — Trung Q Dang
(74) *Attorney, Agent, or Firm* — Murphy, Bilak & Homiller, PLLC

(57) ABSTRACT

In a semiconductor die, source zones of a first conductivity type and body zones of a second conductivity type are formed. Both the source and the body zones adjoin a first surface of the semiconductor die in first sections. An impurity source is provided in contact with the first sections of the first surface. The impurity source is tempered so that atoms of a metallic recombination element diffuse out from the impurity source into the semiconductor die. Then impurities of the second conductivity type are introduced into the semiconductor die to form body contact zones between two neighboring source zones, respectively. The atoms of the metallic recombination element reduce the reverse recovery charge in the semiconductor die. Providing the body contact zones after tempering the platinum source provides uniform and reliable body contacts.

25 Claims, 15 Drawing Sheets

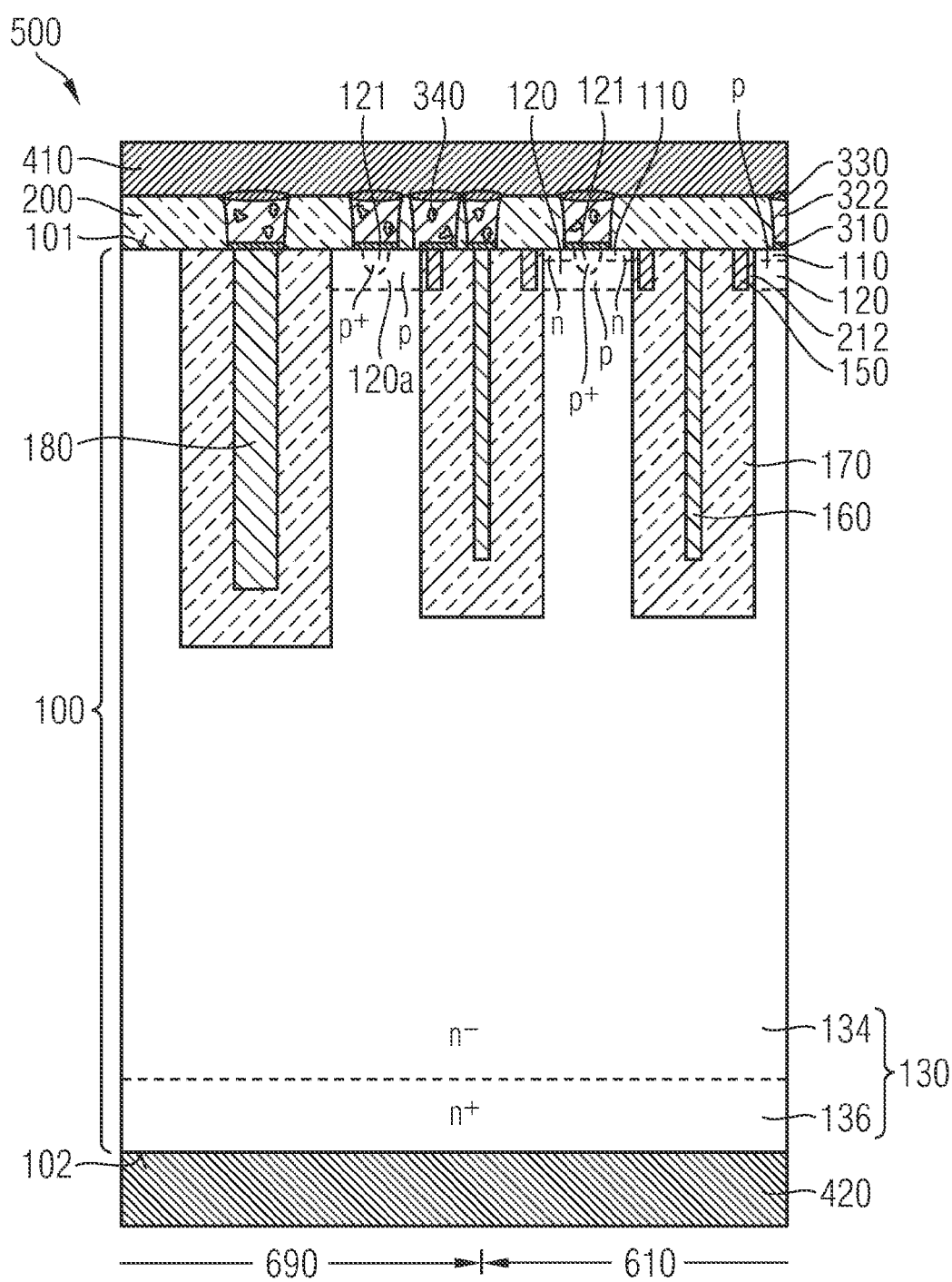

METHOD OF MANUFACTURING A SEMICONDUCTOR DEVICE USING A CONTACT IMPLANT AND A METALLIC RECOMBINATION ELEMENT AND SEMICONDUCTOR

BACKGROUND

In a forward-biased state of a body pn junction of a field effect transistor, charge carriers injected into a drift layer result in an excess charge carrier density that has to be drained off from the drift layer, when the pn junction switches to a reverse bias condition. The reverse recovery charge Qrr drained off from the drift layer contributes to the dynamic switching losses. Some transistor technologies provide introducing platinum impurities into the semiconductor die. The platinum impurities reduce charge carrier lifetime and, as a consequence, the reverse recovery charge. It is desirable to reduce the transistor reverse recovery charge for further field effect transistor designs.

SUMMARY

According to an embodiment, a method of manufacturing a semiconductor device includes forming source zones of a first conductivity type and body zones of a second conductivity type, which is the opposite of the first conductivity type, in a semiconductor die. The source and body zones adjoin a first surface of the semiconductor die in first sections. An impurity source is provided in contact with the first sections of the first surface. The impurity source is tempered so that atoms of a metallic recombination element diffuse out from the impurity source into the semiconductor die. After the tempering, impurities of the second conductivity type are introduced into the semiconductor die to form body contact zones between two neighboring source zones, respectively. The body contact zones have a net dopant concentration at least ten times higher than the body zones.

According to another embodiment, a method of manufacturing a semiconductor device includes forming source zones of a first conductivity type and body contact zones of a second conductivity type, which is the opposite of the first conductivity type, in a semiconductor die. The source and body contact zones adjoin a first surface of the semiconductor die in first sections. A polycrystalline silicon material is deposited to form polysilicon plugs extending through openings in a dielectric layer that adjoins the first surface. The polysilicon plugs are electrically connected to the source and body contact zones. An impurity source is provided in contact with the deposited semiconductor material. The impurity source is tempered. Atoms of a metallic recombination element diffuse out from the impurity source into the semiconductor die and form silicide crystallites in the polysilicon plugs at a distance to the first surface.

According to another embodiment, a semiconductor device includes a field effect transistor structure that includes source zones of a first conductivity type and body contact zones of a second conductivity type which is the opposite of the first conductivity type. The source zones and the body contact zones adjoin first sections of a first surface of a semiconductor die that contains atoms of a metallic recombination element. The body contact zones are formed between two neighboring source zones and are connected with a body zone formed at a distance to the first surface, respectively. In the body contact zones a maximum dopant concentration is at least $10^{19}$ cm$^{-3}$.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 5 is a schematic cross-sectional view of a portion of a semiconductor device in accordance with an embodiment related to an IGFET with polysilicon plugs.

DETAILED DESCRIPTION

Figure 1A:
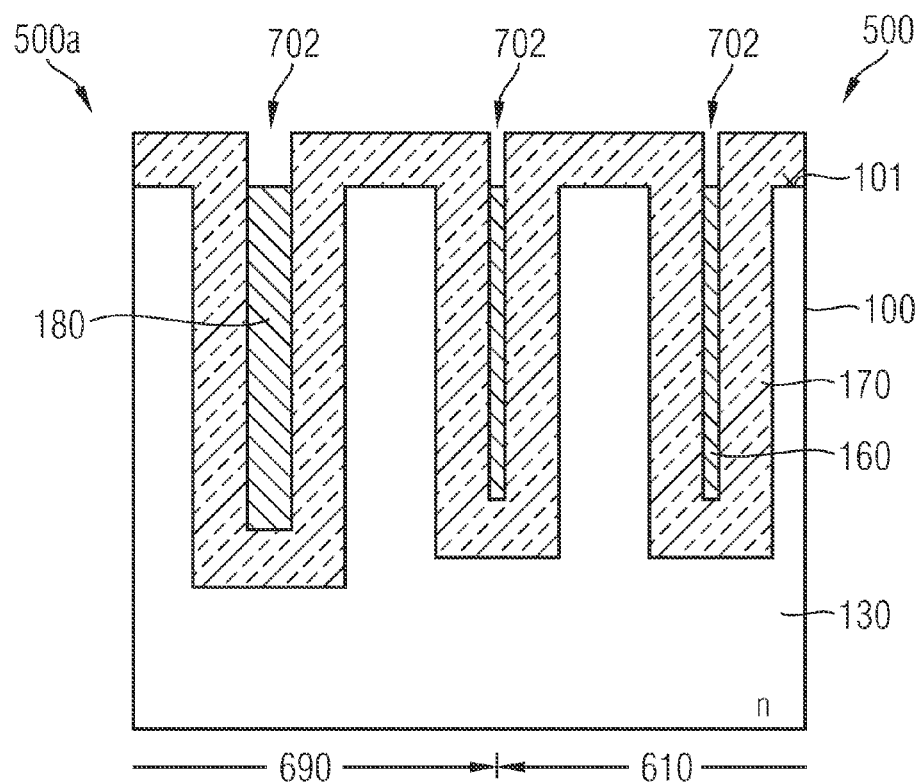
FIG. 1A is a schematic cross-sectional view of a semiconductor substrate during manufacturing of a semiconductor device in accordance with an embodiment bringing a platinum source into contact with a semiconductor die and providing contact trenches.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

FIGS. 1A to 1L refer to a semiconductor substrate 500a for the manufacturing of a plurality of semiconductor devices 500 each including a semiconductor die 100. In a cell area 610 of each semiconductor die 100, elements of one or more field effect transistor (FET) structures are provided that define the function of the semiconductor devices 500, which may be, for example, IGFETs (insulated gate field effect transistors), for example MOSFETs (metal oxide semiconductor field effect transistors) in the usual meaning including FETs with metal and with non-metal gate electrodes, or IGBTs (insulated gate bipolar transistors). Each field effect transistor structure may include a plurality of transistor cells arranged in one or more cell arrays. In an edge area 690 surrounding the cell area 610, each semiconductor die 100 includes an edge termination construction for providing a sufficiently high reverse breakdown voltage in a lateral direction.

FIG. 1A shows a portion of one of a plurality of semiconductor dies 100 formed in a semiconductor substrate 500a. The semiconductor substrate 500a is a wafer, for example a monocrystalline silicon wafer. Outside the illustrated portion the semiconductor substrate 500a may include further doped and undoped sections, epitaxial semiconductor layers and previously fabricated insulating structures.

A doped layer 130 of a first conductivity type is formed in each semiconductor die 100. The doped layer 130 may include two or more sub-layers having different dopant concentrations. Further conductive structures, structures of a second conductivity type and insulator structures may be formed in the doped layer 130. Trenches are introduced from a first surface 101 of the semiconductor substrate 500a into the semiconductor dies 100 in both the cell areas 610 and the edge areas 690. The trenches may have the same shape and dimensions in the cell areas 610 and the edge areas 690. According to the illustrated embodiment, the trenches formed in the edge areas 690 are deeper and wider than the trenches formed in the cell area 610. The trenches may have approximately vertical sidewalls and may have a depth ranging from 5 to 25 micrometer, for example from 8 to 15 micrometer. According to an embodiment the depth of the trenches is 9 micrometer. Within the cell area 610 the trenches may be evenly spaced at a pitch from about 1 micrometer to 10 micrometer, for example from 3.5 to 4.5 micrometer. The width of the trenches may range from 0.5 to 5 micrometer, for example from 2.5 to 3.5 micrometer.

Trench insulation structures 170 line the trenches in both the cell areas 610 and the edge areas 690. The trench insulation structures 170 may be formed from a deposited silicon oxide. The thickness of the trench insulation structures 170 may range from 0.8 micrometer to 2.0 micrometer, for example from 1.0 to 1.4 micrometer.

Conductive material, for example highly doped polycrystalline silicon is deposited on the semiconductor substrate 500a to fill the trenches. The deposited conductive material is etched back to form field electrodes 160 in the trenches of the cell areas 610 and further field electrodes 180 in the trenches of the edge areas 690. The conductive material is etched back such that exposed edges of the field electrodes 160, 180 are approximately flush with the first surface 101. Gaps 702 result above the field electrodes 160, 180. A sacrificial material may be deposited on the semiconductor substrate 500*a* to fill the gaps 702 of FIG. 1A.

Figure 1B:
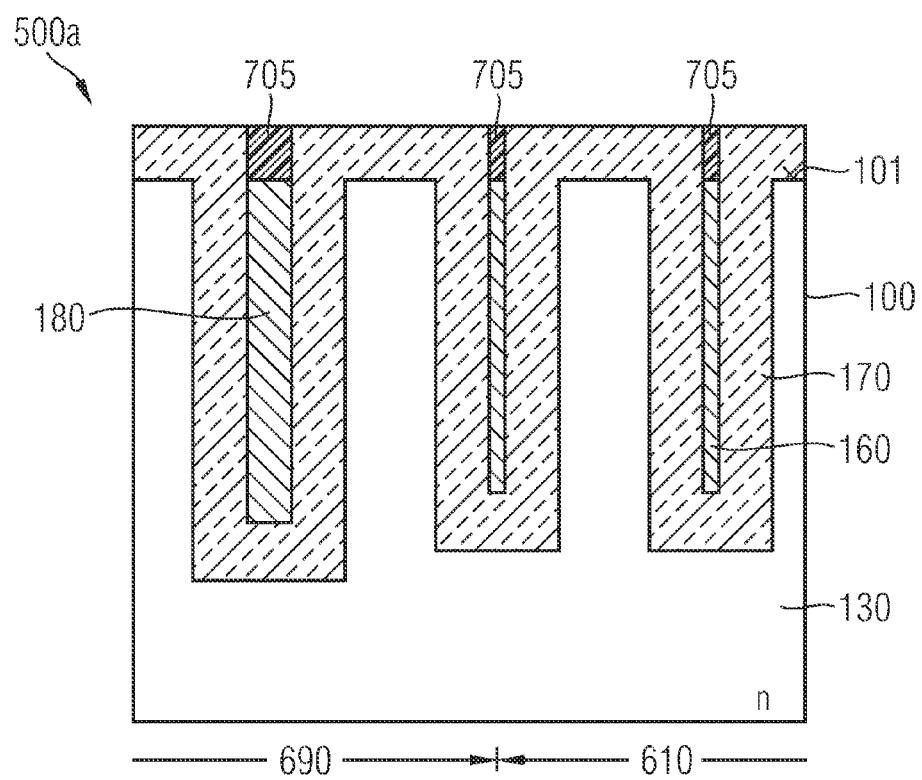
FIG. 1B is a cross-sectional view of the semiconductor substrate of FIG. 1A after providing auxiliary fills.

FIG. 1B shows the gaps 702 of FIG. 1A filled with the sacrificial material, which may be a photo resist, carbon, silicon oxide or any other material having different material properties than the conductive material of the field electrodes 160, 180. The semiconductor substrate 500*a* may be planarized at least up to the first surface 101 wherein trench depth variations may be compensated.

Figure 1C:
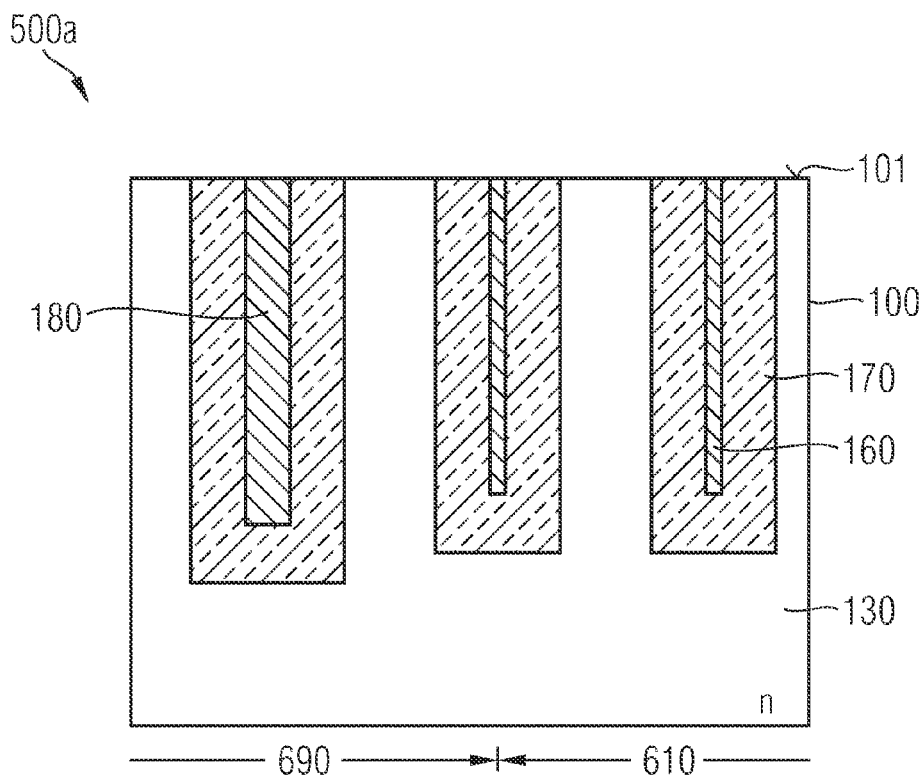
FIG. 1C is a schematic cross-sectional view of the semiconductor substrate of FIG. 1B after exposing and planarizing the semiconductor die.

FIG. 1C illustrates the semiconductor substrate 500*a* after planarizing, wherein the exposed surfaces of the field electrodes 160, 180 and the semiconductor dies 100 are flush with each other. An auxiliary layer is deposited on the semiconductor substrate 500*a* and patterned by photolithographic processes to form an etch mask 710 with openings 712 exposing outer portions of the trench insulation structures 170 directly adjoining portions of the semiconductor dies 100 between neighboring trench structures in the cell areas 610. The outer portions may extend from the vertical edge between the semiconductor dies 100 and the concerned trench insulation structure 170 up to at least 200 nm, for example about 350 nm, into a direction of the corresponding field electrode 160, the vertical edge extending orthogonal to the first surface 101. The etch mask 710 covers the field electrodes 160 and further portions of the trench insulation structures 170 directly adjoining the field electrodes 160. In the edge areas 690 no openings 712 are formed. The etch mask 710 may cover the edge areas 690 completely.

Figure 1D:
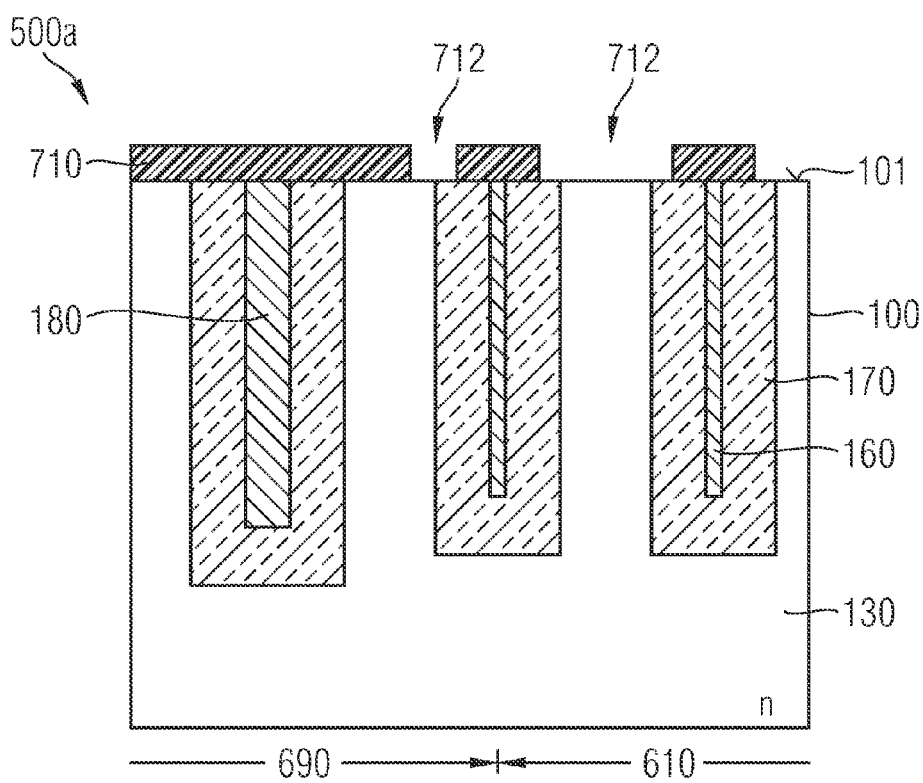
FIG. 1D is a schematic cross-sectional view of the semiconductor substrate of FIG. 1C after providing an etch mask.

According to FIG. 1D the etch mask 710 covers the edge areas 690 as well as the field electrodes 160 and central portions of the trench insulation structures 170 directly adjoining the field electrodes 160. The material of the etch mask 710 is a material which etch properties differ from the etch properties of the material of the trench insulation structures 170 and the semiconductor die 100, e.g. amorphous silicon or a photo resist. Openings 712 expose outer portions of the trench insulation structures 170 directly adjoining portions of the semiconductor die 100 between neighboring trench structures. Using the etch mask 710 the material of the trench insulator structures 170 is selectively etched against the semiconductor die 100 up to a depth of several 100 nanometer, for example more than 200 nanometer.

Figure 1E:
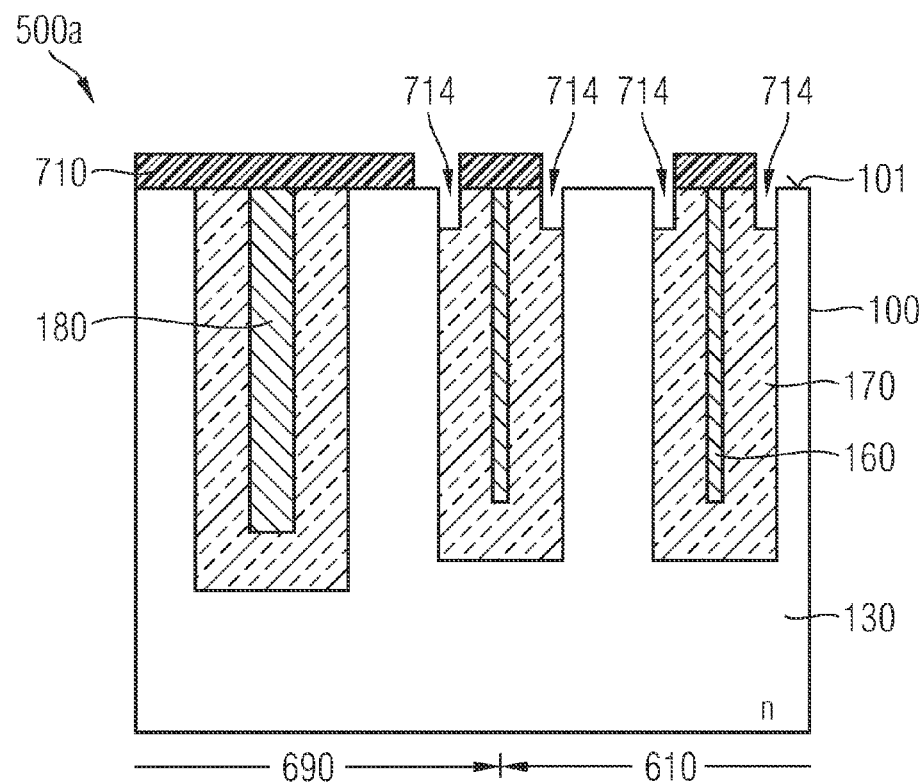
FIG. 1E is a schematic cross-sectional view of the semiconductor substrate of FIG. 1D after etching pockets for gate electrodes.

FIG. 1E shows pockets 714 resulting from the anisotropic etch of the trench insulation structures 170 selectively to the semiconductor die 100. With regard to the first surface 101 the pockets 714 may have a depth of 600 nanometer, by way of example. After forming the pockets 714, the etch mask 710 is removed and a gate dielectric is provided, for example by depositing a suitable dielectric material or by thermally growing silicon oxide. The remaining pockets 714 are filled with a conductive material which is then removed from outside the pockets 714, for example by a planarization process like chemical mechanical polishing.

Figure 1F:
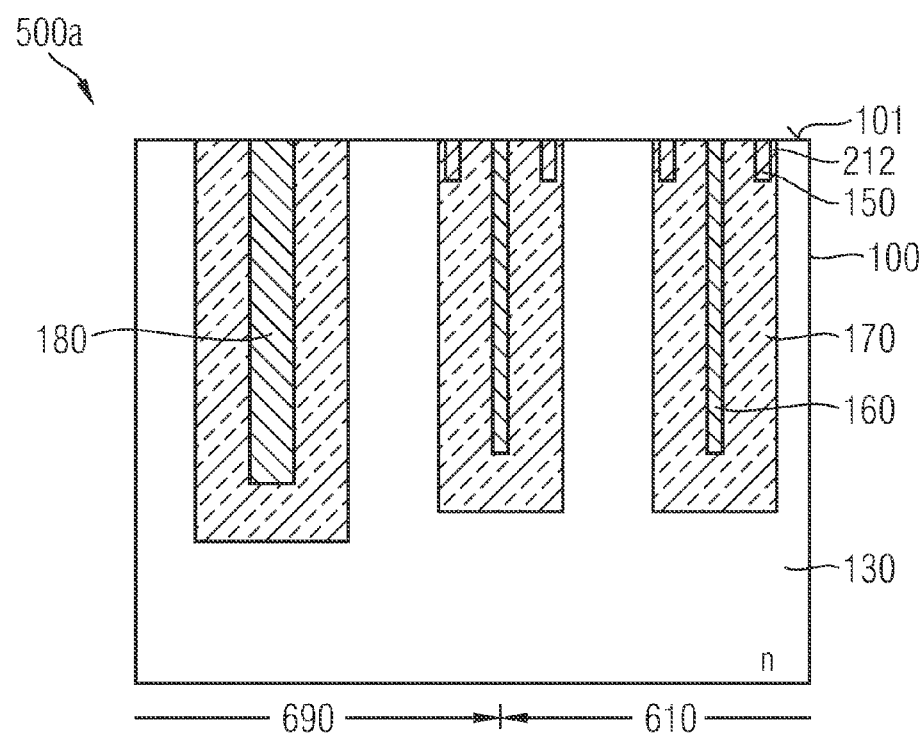
FIG. 1F is a schematic cross-sectional view of the semiconductor substrate of FIG. 1E after providing gate electrodes.

FIG. 1F shows gate electrodes 150 resulting from the deposited conductive material and gate dielectrics 212 insulating the gate electrodes 150 from the semiconductor die 100. The conductive material may be highly doped polycrystalline silicon. According to another embodiment, the gate electrodes 150 consist of or include one or more metal structures, e.g. a titanium nitride TiN layer and a tungsten W fill. A stray oxide may be formed on the first surface 101 and a first impurity mask 720 may be provided that covers the edge area 690.

Figure 1G:
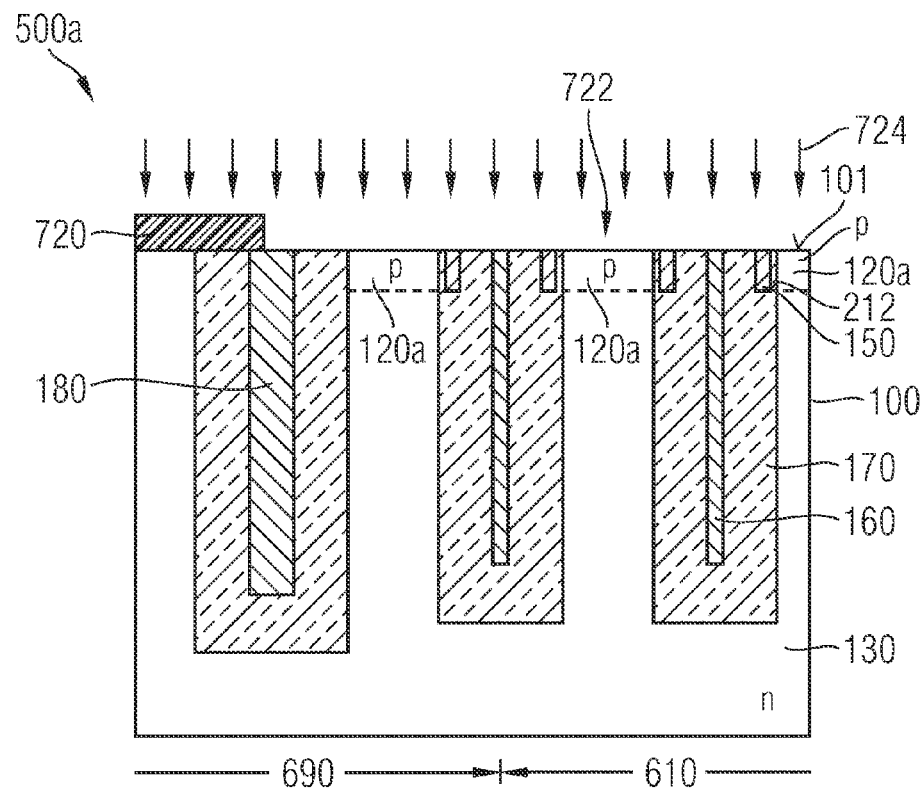
FIG. 1G is a schematic cross-sectional view of the semiconductor substrate of FIG. 1F during formation of body wells.

As shown in FIG. 1G the first impurity mask 720 may cover the semiconductor dies 100 at least in portions of the edge areas 690. Openings 722 expose the semiconductor dies 100 in the cell areas 610. Impurities of the second conductivity type 724 are introduced into the exposed portions of the semiconductor dies 100, for example by using an implant process. Other embodiments may introduce the impurities of the second conductivity type 724 without providing the first impurity mask 720.

The first impurity mask 720 is removed and the semiconductor substrate 500*a* is tempered to form body wells 120*a* that directly adjoin the first surface 101. In the finalized semiconductor device 500, a buried edge of the body wells 120*a* is approximately flush with the buried edges of the gate electrodes 150. A further auxiliary layer may be deposited and patterned by photolithographic techniques to form a second impurity mask 730.

Figure 1H:
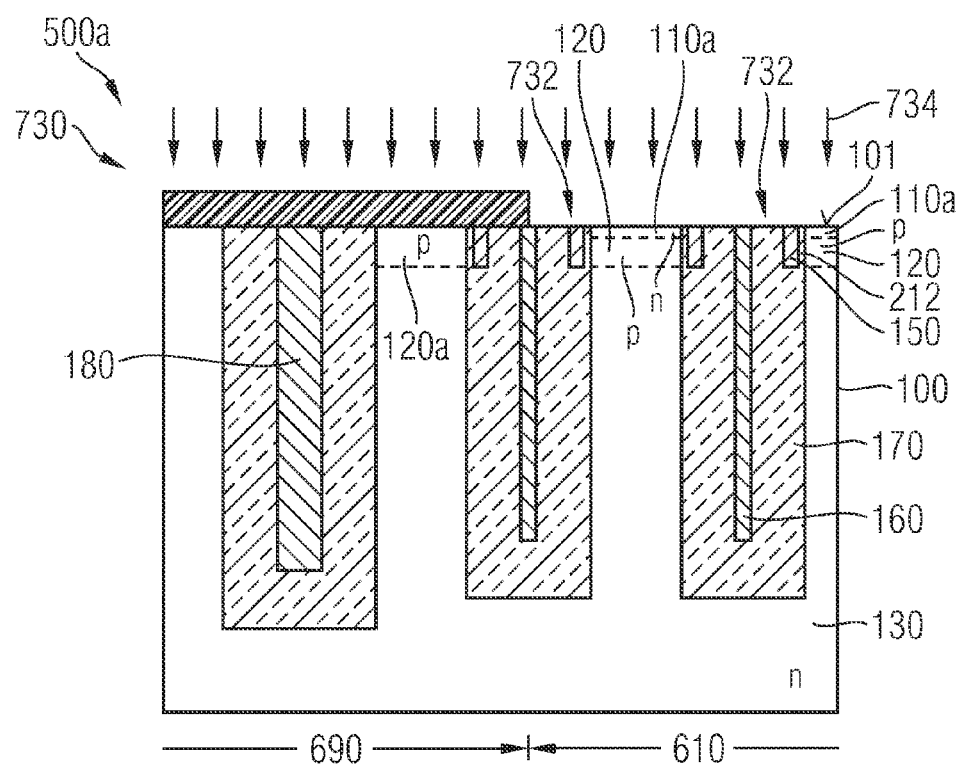
FIG. 1H is a schematic cross-sectional view of the semiconductor substrate of FIG. 1G during formation of source wells.

FIG. 1H shows the second impurity mask 730 covering the edge areas 690. In the cell areas 610 openings the second impurity mask 730 expose at least the body wells 120*a*. The second impurity mask 730 may further expose the gate electrodes 150 and the field electrodes 160 in the cell areas 610.

The second impurity mask 730 is used to form source wells 110*a* of the first conductivity type within portions of the body wells 120*a*. Remaining portions of the second conductivity type form body zones 120. One or more dielectric material(s) may be provided on the first surface 101 and patterned by photolithographic means.

Figure 1I:
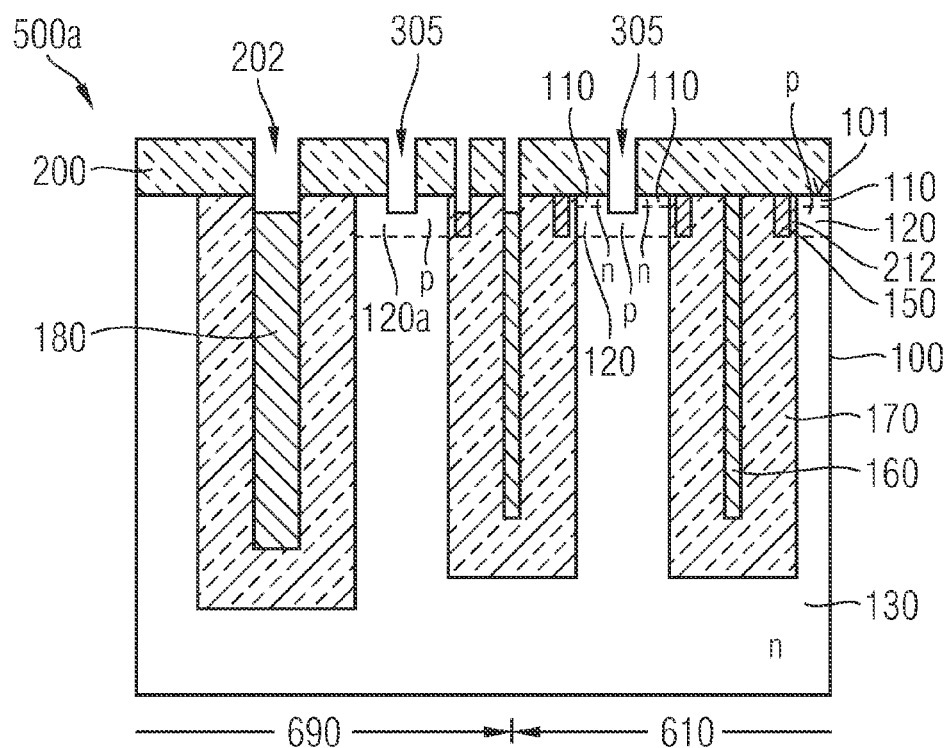
FIG. 1I is a schematic cross-sectional view of the semiconductor substrate of FIG. 1H after etching contact trenches into the semiconductor die.

FIG. 1I shows a dielectric layer 200 formed directly on the first surface 101 from the provided dielectric material(s). Forming the dielectric layer 200 may include sequential deposition of two or more sub-layers. For example, a silicon oxynitride sub-layer may be formed at least in portions of the first surface 101 where the semiconductor dies 100, the field electrodes 160, 180 or the gate electrodes 150 are exposed. A further dielectric sub-layer may be provided that is effective as an adhesive layer, for example USG (undoped silicate glass). A main dielectric layer may be provided from doped silicate glass, e.g. BSG, PSG or BPSG. The thickness of the dielectric layer 200 in total may range from 500 nm to 5000 nm, for example from 1000 nm to 2000 nm.

The dielectric layer 200 may be patterned in total by photolithographic means such that openings 202 in the dielectric layer 200 expose at least central portions of the source wells 110*a* in the cell areas 610. The central portions may have approximately equal distances to both neighboring gate electrodes 150. According to other embodiments, in the edge areas 690, one or more of the body wells 120*a*, or field electrodes 180 may be exposed. Using the patterned dielectric layer 200 as etch mask, contact trenches 305 may be etched through the source wells 110*a* into the semiconductor die 100, wherein source zones 110 are formed from the source wells 110*a* on opposing sides of the contact trenches 305. The contact trenches 305 reach or extend into the body zones 120.

An impurity source is brought into contact with at least the exposed sections of the semiconductor die 100. The impurity source contains atoms of a metallic recombination element which may substitute silicon in a crystal lattice and which provides quantum mechanical states in the band gap of the semiconductor material of the semiconductor die, being effective as recombination centers for both holes and electrons in a silicon crystal. The metallic recombination element may be a heavy metal with suitable diffusion properties in a silicon crystal. By way of example, the metallic recombination element is platinum Pt, palladium Pd, vanadium V, iridium Ir or gold Au. According to an embodiment the metallic recombination element is platinum Pt.

The impurity source may be a solution containing the metallic recombination element, for example, a platinum containing solution like hexachloroplatinic acid $H_2PtCl_6$ solved in 1M HCl. The solution is brought into contact with the exposed sections of the first surface 101. The solution may be spin-coated onto the semiconductor substrate 500a. According to another embodiment, the semiconductor substrate 500a is immerged into the solution.

In accordance with a further embodiment, platinum, vanadium, palladium, iridium and/or gold atom or ions may be implanted using the patterned dielectric layer 200 as an impurity mask. According to another embodiment at most five, for example one or two atomic layers of platinum, vanadium, palladium, iridium and/or gold are deposited on the exposed sections of the first surface 101 and the dielectric layer 200. According to a further embodiment, a platinum, vanadium, palladium, iridium and/or gold containing layer, for example a platinum layer with a thickness of about 20 nanometer, is deposited on the dielectric layer 200 and into the openings and tempered such that the material of the deposited layer selectively reacts with the silicon material of the semiconductor die 100 to form silicides, for example PtSi, selectively along interfaces with the semiconductor die 100. According to an embodiment layered platinum silicide structures 700 are formed on exposed surfaces of the semiconductor dies 100 through tempering at a temperature between 450 and 500 degree Celsius, for example at about 470 degree Celsius.

Figure 1J:
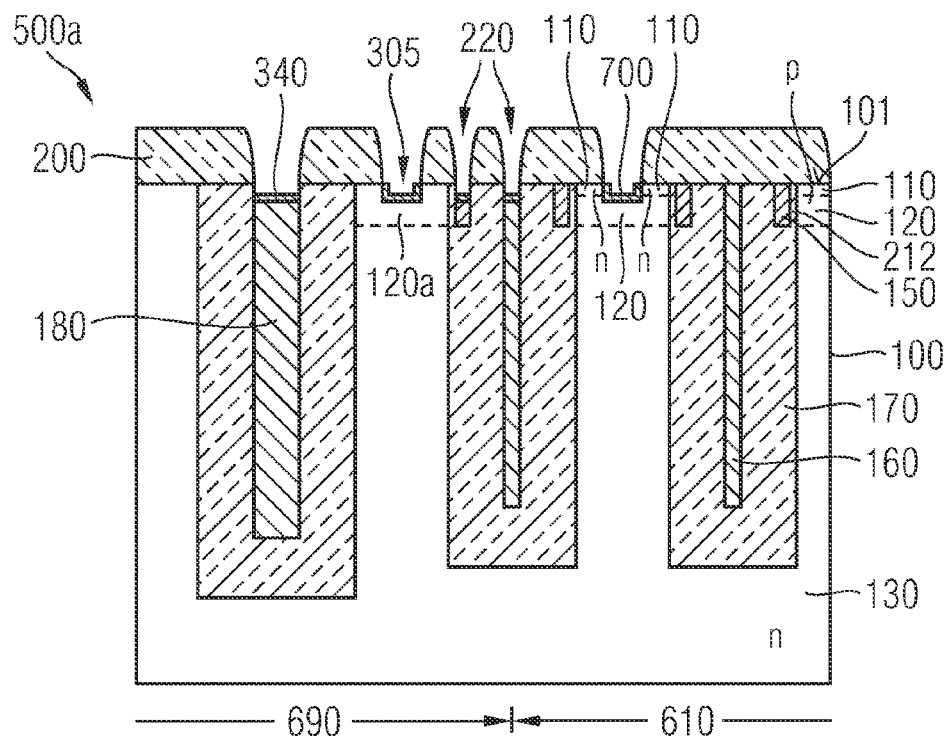
FIG. 1J is a schematic cross-sectional view of the semiconductor substrate of FIG. 1I after providing an impurity source on exposed sections of the first surface.

FIG. 1J shows the platinum silicide structures 700 formed on sidewalls of the contact trenches 305. In addition, platinum silicide structures 700 may be formed on exposed surfaces of, for example, the field electrode 180 and further gate electrodes assigned to an edge area 169. The semiconductor substrate 500a is tempered at a temperature of at least 750 degree Celsius, for example in a range from 750 to 950 degree Celsius, for example at 880 degree Celsius such that platinum atoms or ions diffuse from the platinum silicide structures 700 into the semiconductor die 100. The platinum silicide structures 700 may be removed by applying a suitable etch process.

After the tempering for controlling the diffusion of platinum Pt atoms or, if applicable, after the removal of the platinum silicide structures 700, impurities of the second conductivity type 724 are introduced through the openings 212 of the dielectric layer 200 to form body contact zones 121 having a higher dopant concentration than the body zones 120. For example, the net dopant concentration in the body contact zones 121 may be at least ten times higher than the net dopant concentration in the body zones 120. For example, the maximum dopant concentration in the body contact zones 121 may be greater $10^{19}$ cm$^{-3}$.

Figure 1K:
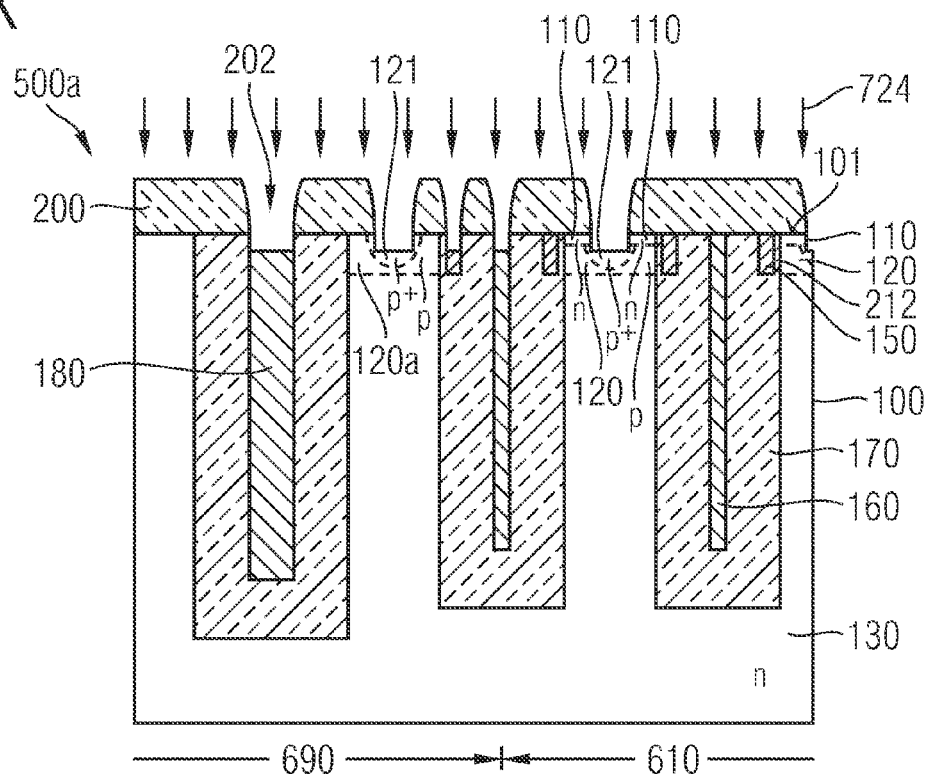
FIG. 1K is a schematic cross-sectional view of the semiconductor substrate of FIG. 1J during formation of body contact zones.

As shown in FIG. 1K the openings 202 in the dielectric layer 200 may be rounded as a result of the temper process performed for diffusing out the platinum atoms. The body contact zones 121 provide a low-ohmic contact to the body zones 120. While according to the illustrated embodiment impurities of the second conductivity type 724 are also introduced into the gate electrodes 150 and field electrodes 180 in the edge area, other embodiments may provide an impurity mask that shields one, more or all of the field electrodes 160, 180 and the gate electrodes 150 against the impurities of the second conductivity type 724. The impurities of the second conductivity type 724 may be introduced by out diffusion from the gaseous phase or by an implant process, by way of example.

A metal, for example titanium Ti, tantalum Ta, palladium Pd may be deposited and tempered to form metal silicide 310 for interfacing at least the body contact zones 121 and the source zones 110. A titanium nitride layer may be provided to contact the gate electrodes 150. A further metal, for example tungsten W may be deposited to provide metal plugs 320 filling the openings in the dielectric layer 200. A first metal layer 410 may be deposited on the surface of the metal plugs 320. The metal layer 410 may contain aluminum, copper or alloys of aluminum and/or copper.

Figure 1L:
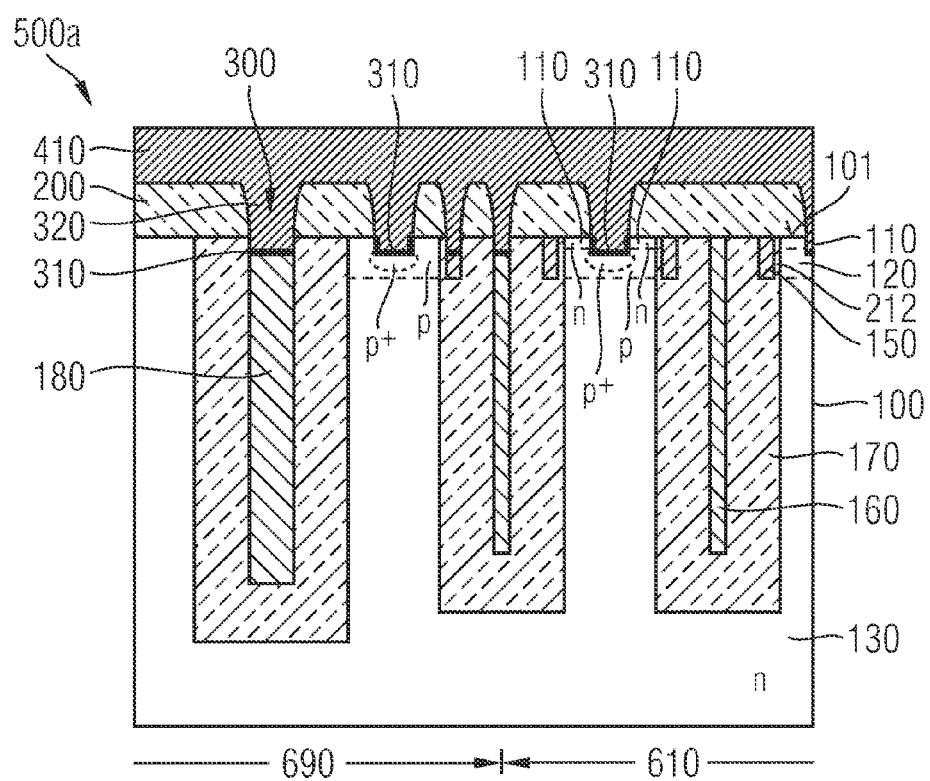
FIG. 1L is a schematic cross-sectional view of the semiconductor device of FIG. 1K after providing metal plugs and a first metal layer.

FIG. 1L shows contact plugs 300 including metal silicide 310 at least at the interface between the metal plugs 320 and the source zones 110 and the body contact zones 121. The dielectric layer 200 separates the first metal layer 410 from the first surface 101. The first metal layer 410 is electrically connected with at least the source and body zones 110, 120 in the cell area 610 through the contact plugs 300, which fill the contact trenches 305.

Since the body contact zones 121 are formed only after the high temperature step for diffusing platinum Pt atoms, the body contact zones 121 and as a result the characteristics of the body contacts can be precisely and uniformly tuned. The body contacts are not degraded by the high temperature step. Since tempering of the platinum source is not effective on the later provided implant for the formation of the body contact zones 121, the impurities forming the body contact zones 121 are not diffused out of the body contact zones 121. The body contact zones 121 have a maximum dopant concentration higher $10^{19}$ cm$^{-3}$. The gradient of a normalized dopant concentration of the body contact zones 121 normalized to the maximum dopant concentration of the source zones 110 is significantly steeper than the gradient of the dopant concentration of the source zones 110.

Other than approaches providing diffusion of platinum Pt through polysilicon plugs contacting the source and body contact zones 110, 121, the present embodiments avoid any degradation of the body contacts that may result from the out diffusion of n-type dopants contained in the polysilicon plugs into the adjoining p-type body contact zones 121.

Further other than approaches relying on polysilicon plugs for contacting the source and body contact zones 110, 121, the present embodiments avoid any degradation of the contact plugs 300 that may result from the out diffusion of p-type dopants contained in the dielectric layer 200, for example Boron B, into an adjoining n-type polysilicon plug.

Where a distance is sufficiently high between contact regions accessible for the formation of platinum silicide on the one hand and the channel regions of the body zones 120, the high temperature step controlling the platinum diffusion does not strongly affect the on-state characteristics of the field effect transistor structure. Growing the platinum silicide before formation of the body contact zones 121 allows for introducing platinum into the semiconductor die 100 from a wafer front side where most of the lithographic, etch and depositing processes are performed without strong adverse effects on the transistor performance.

Figure 2A:
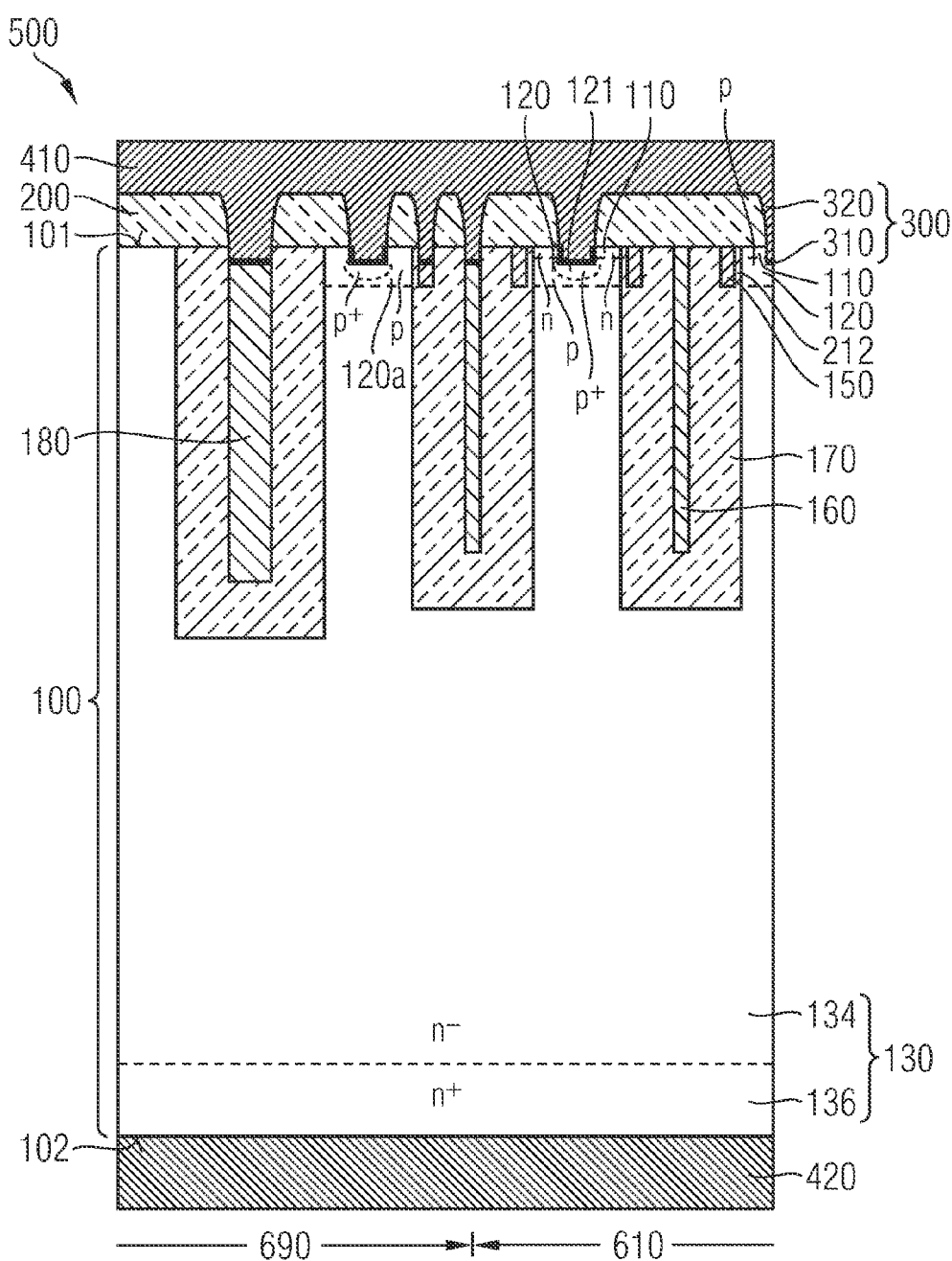
FIG. 2A is a schematic cross-sectional view of a portion of a semiconductor device according to an embodiment related to an IGFET (insulated gate field effect transistor) with metal plugs filling contact trenches extending into a semiconductor die.

FIG. 2A illustrates a portion of a semiconductor device 500 which may result, by way of example from the method as described with reference to FIGS. 1A to 1L. A cell area 610 includes field effect transistor structures formed in a semiconductor die 100 with a first surface 101 and a second surface 102 opposing the first surface 101. Gate trench structures extend from the first surface 101 into the semiconductor die 100. In the gate trench structures, gate electrodes 150 and field electrodes 160 are formed, for example from highly doped polycrystalline silicon. The field electrodes 160 extend deeper into the semiconductor die 100 than the gate electrodes 150. The buried gate electrodes 150 may be electrically coupled to a gate terminal of the semiconductor device 500 or to an output terminal of a gate driver circuit integrated in the semiconductor device 500. The buried field electrode 160 is not electrically coupled to the gate electrode. The buried field electrodes 160 may be without connection to other elements of the semiconductor device 500 and may float. According to other embodiments, the buried field electrodes 160 may be electrically coupled to a source electrode, an output terminal of a driver circuit integrated in a semiconductor device 500 or an input terminal of the semiconductor device 500.

Trench insulation structures 170 insulate the buried field electrodes 160 from the semiconductor die 100 and insulate the buried field electrodes 160 from the buried gate electrodes 150. The trench insulation structures 170 may be provided from silicon oxide which may be thermally grown or deposited, for example using TEOS (tetraethylorthosilane) as precursor material, a silicate glass, silicon nitride, silicon oxynitride or any combination thereof, by way of example. A gate dielectric 212 electrically insulates the buried gate electrode 150 from the semiconductor die 100. The gate dielectric 212 may be thermally grown or deposited semiconductor oxide, e.g. silicon oxide.

The semiconductor die 100 provides source zones 110 of a first conductivity type and body zones 120 of a second conductivity type, which is the opposite of the first conductivity type. Between two neighboring gate trench structures two source zones 110 are formed respectively. The two source zones 110 are separated from each other. Body zones 120 are disposed at a distance to the first surface 101 with the source zones 110 in-between. Contact trenches extend into the semiconductor die 100 and separate neighboring source zones 110. Body contact zones 121 are formed below the contact trenches between two neighboring source zones 110 respectively and provide a low-ohmic contact to the body zones 120.

Sections of the semiconductor die 100 between the body zones 120 and a second surface 102 of the semiconductor die 100, which is opposite to the first surface 101, form a drain layer 130 of the first conductivity type.

The drain layer 130 may include two or more sub-layers which differ from each other by their dopant concentration. By way of example, the drain layer 130 may include a highly doped substrate layer 136 close to or directly adjoining the second surface 102. The net dopant concentration in the substrate layer 136 may be in the range from $10^{17}$ cm$^{-3}$ to $10^{20}$ cm$^{-3}$, for example in the range from $10^{19}$ cm$^{-3}$ to $10^{20}$ cm$^{-3}$. As illustrated, the drain layer 130 may further include a lower doped drift layer 134 which may extend between the body zones 120 and the substrate layer 136. A dopant concentration in the drift layer 134 may be, for example, between $5 \times 10^{14}$ and $10^{17}$ cm$^{-3}$. According to another embodiment, the drain layer 130 may further include a compensation layer between the body zones 120 and the drift layer 134, wherein in the compensation layer the dopant concentration exceeds that of the drift layer 134. The dopant concentrations in the compensation layer and the drift layer 134 may or may not be a function of the distance to the first surface 101. For example, the dopant concentration may decrease towards the second surface 102 in the compensation layer and at least a portion of the drift layer 134. According to other embodiments a field stop layer having a dopant concentration higher than in the drift layer 134 and lower than in the substrate layer 136 may be formed between the drift layer 134 and the substrate layer 136.

The body zones 120 and the gate electrodes 150 are arranged at approximately the same distance to the first surface 101. The distance of a first edge of the body zones 120 oriented to the first surface 101 is approximately the same as the distance of a first edge of the gate electrodes 150 to the first surface 101. A distance between the first surface 101 and a second edge of the body zones 120 oriented to the second surface 102 is approximately the same as the distance between the first surface 101 and the second edge of the gate electrodes 150 oriented to the second surface 102.

The illustrated embodiment refers to enhancement-type field effect transistor structures with the first conductivity type being the n-type and the second conductivity type being the p-type. According to other embodiments, the first conductivity type is the p-type and the second conductivity type is the n-type. Further embodiments may refer to depletion-type field effect transistor structures. In an off-state, the pn-junctions of the body zones 120 are reverse biased and inhibit a current flow between the source zones 110 and the drain layer 130. In an on state, a positive potential applied to the gate electrodes 150 controls the charge carrier distribution in a channel portion of the body zones 120 along the gate dielectrics 212 to form an n-type conductive channel between the source zones 110 and the drain layer 130.

A dielectric layer 200 is formed in direct contact with the first surface 101. The dielectric layer 200 may include one or more sub-layers, for example an adhesion layer, a buffer layer and/or a diffusion barrier layer. According to an embodiment, the dielectric layer 200 includes a thermally grown silicon oxide layer 210 which may be formed contemporaneously with the gate dielectric 212. The dielectric layer 200 may further include a diffusion barrier layer 220, for example a silicon nitride or silicon oxynitride layer. A thin silicon oxide layer provided from deposited oxide, for example using TEOS as precursor material, or a silicate glass, for example undoped silicate glass, may form an adhesive or buffer layer 230. The dielectric layer 200 may further include a main dielectric layer 240 provided from BSG (boron silicate glass), PSG (phosphorus silicate glass) or BPSG (boron phosphorus silicate glass). Other embodiments may provide less or more sub-layers.

The semiconductor device 500 further includes a first metal layer 410 which the dielectric layer 200 separates from the semiconductor die 100. A second metal layer 420 directly adjoins the second surface 102. The first metal layer 410 may provide a source electrode and the second metal layer 420 may provide a drain electrode of the semiconductor device 500. The first and second metal layers 410, 420 may consist of or contain, as main constituent(s), aluminum Al, copper Cu or alloys of aluminum or copper, for example AlSi, AlCu, or AlSiCu. According to other embodiments, the first and/or second metal layers 410, 420 may contain, as main constituents, nickel Ni, titanium Ti, silver Ag, gold Au, platinum Pt and/or palladium Pd. For example, at least one of the metal layers 410, 420 may include two or more sub-layers, each sub-layer containing one or more of Ni, Ti, Ag, Au, Pt, Pd as main constituent(s) and/or alloys therefrom.

Contact plugs 300 electrically connect the first metal layer 410 with the source and body zones 110, 120. The contact plugs 300 may include a metal silicide 310, wherein the metal may be titanium Ti, tantalum Ta or tungsten W, by way of example. The metal silicide 310 is formed along the interface between the contact plugs 300 and the semiconductor die 100. Each contact plug 300 further includes a metal plug 320 provided from, e.g. tungsten W, wherein one or more liners of a metal compound, e.g. titanium nitride may be provided between a tungsten W fill and the dielectric layer 200 and the metal silicide 310.

In an edge area 690 surrounding the cell area 610 an edge termination construction defines the reverse breakdown voltage of the edge area 690 which should be greater than the reverse breakdown voltage of the cell area 610, wherein the reverse breakdown voltage is the minimum applied voltage that causes the semiconductor device 500 to break down in the reverse mode. In an inner portion of the edge area 690 oriented to the cell area 610 further gate trench structures extending from the first surface 101 into the semiconductor die 100 do not include operable gate electrodes. Source zones 110 may be absent in the inner portion 691. Field trenches may extend from the first surface 101 into the semiconductor die 100 to provide further field electrodes 180. The further field electrodes 180 may be electrically connected or coupled to the first metal layer 410.

When the body pn junction between the body zone 120 and the drain layer is forward biased, charge carriers injected into the drift layer 134 also diffuse into the edge area 690. When the body pn junction switches to a reverse-biased state, the charge carriers diffused into the edge area 690 contribute to the reverse recovery charge, which must be drained off by the field effect transistor structures disposed directly adjoining the edge area 690. The charge carriers drained off from the edge area 690 add to the excess charge carriers in the cell area 610 and may significantly increase current densities in a border portion of the cell area 610 adjoining the edge area 690. Since the current densities increase with increasing di/dt, at a sufficiently high di/dt, the increased current densities result in locally increased temperatures in the border portion. Shortening charge carrier life time results in a lower charge carrier diffusion length such that the portion of the edge area 690 in which charge carriers diffuse when the body pn junction is forward biased is significantly reduced and less charge carriers have to be drained off. As a result, the semiconductor device 500 becomes more robust.

Figure 2B:
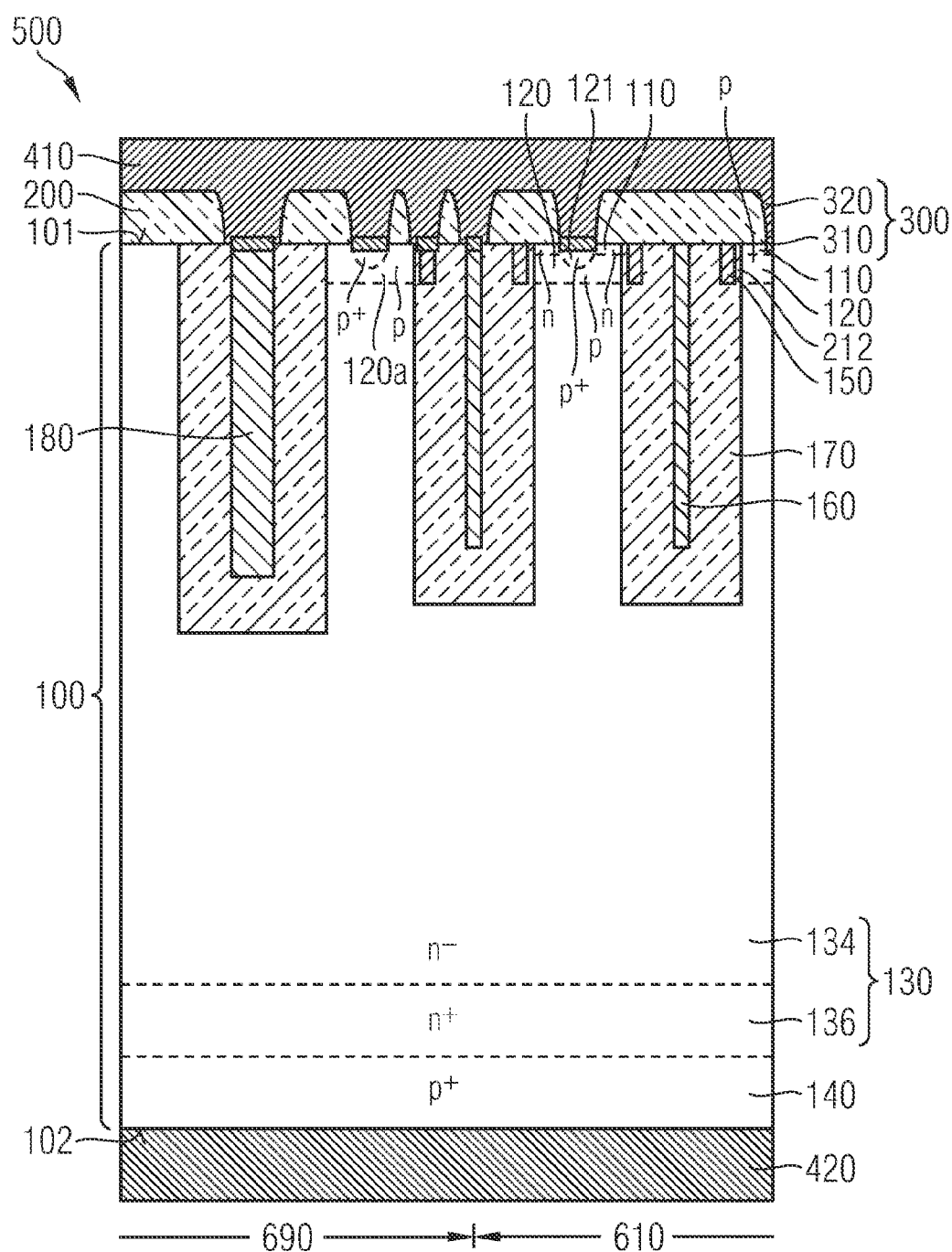
FIG. 2B is a schematic cross-sectional view of a semiconductor device according to an embodiment related to an IGBT (insulated gate bipolar transistor) with metal plugs ending on a surface of a semiconductor die.

FIG. 2B refers to an embodiment with the semiconductor device 500 providing an IGBT. The IGBT may include the same elements as the IGFET of FIG. 2B. In addition a collector layer 140 of the second conductivity type is provided between the doped layer 130 and the second surface 102. The first metal layer 410 provides an emitter electrode and the second metal layer 420 a collector electrode of the semiconductor device 500.

Further FIG. 2B provides metal plugs 320 electrically connecting the first metal layer 410 with the source zones 110 and the body contact zones 121. The metal plugs 320 end on the first surface. Outside the gate trench structures, the first surface 101 is approximately planar in the cell area 610. A portion of the semiconductor die 100 separating two neighboring source zones 110 does not include impurities resulting from the formation of the source zones 110. A distance between contact regions accessible for the formation of platinum silicide on the one hand and the channel regions of the body zones 120 on the other hand is increased and the high temperature step controlling the platinum diffusion does not strongly affect the on-state characteristics of the field effect transistor structure.

FIGS. 3A to 3E refer to an embodiment without contact trenches. A semiconductor substrate 500a may be processed as shown in FIGS. 1A to 1G to provide body wells 120a in a semiconductor die 100. A second impurity mask 730 is deposited and patterned and impurities of the first conductivity type are introduced into the body wells 102a.

Figure 3A:
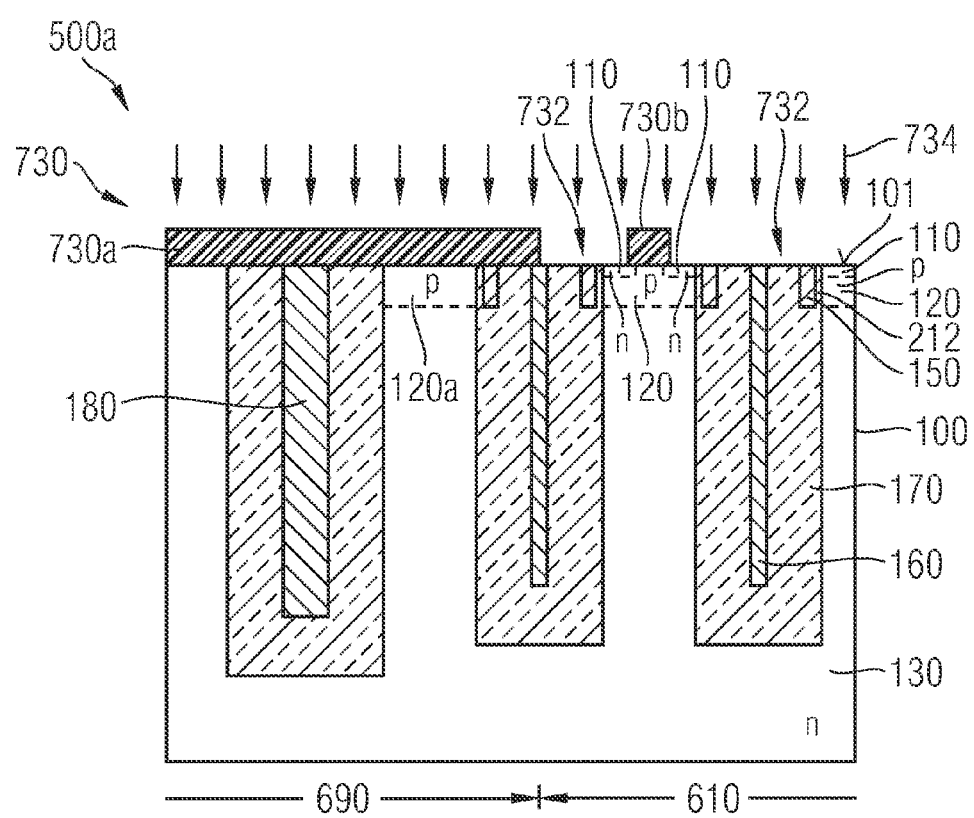
FIG. 3A is a schematic cross-sectional view of a semiconductor substrate during manufacturing of a semiconductor device in accordance with an embodiment providing bringing a platinum source into contact with a semiconductor die after forming source zones.

According to FIG. 3A, the second impurity mask 730 includes first portions 730a covering, in the edge areas 690, at least the exposed surfaces of the semiconductor dies 100 and second portions 730b covering central portions of the exposed surfaces of the body wells 120a. The second portions 730b may have approximately equal distances to both neighboring gate electrodes 150. In the cell areas 610 openings 732 of the second impurity mask 730 expose at least outer portions of body wells 120a oriented to the gate electrodes 150. The openings 732 may further expose the gate electrodes 150 and the field electrodes 160 in the cell areas 610.

The second impurity mask 730 is used to form source zones 110 of the first conductivity type in the body wells 120a of the second conductivity type. The second portions 730b of the second impurity mask 730 inhibit impurities of the first conductivity type from impinging into the shielded portions of the body wells 120a such that the body zones 120 emerging from the body wells 120a include extension portions directly adjoining the first surface 101 respectively. One or more dielectric material(s) may be provided on the first surface 101 and patterned by photolithographic means.

Figure 3B:
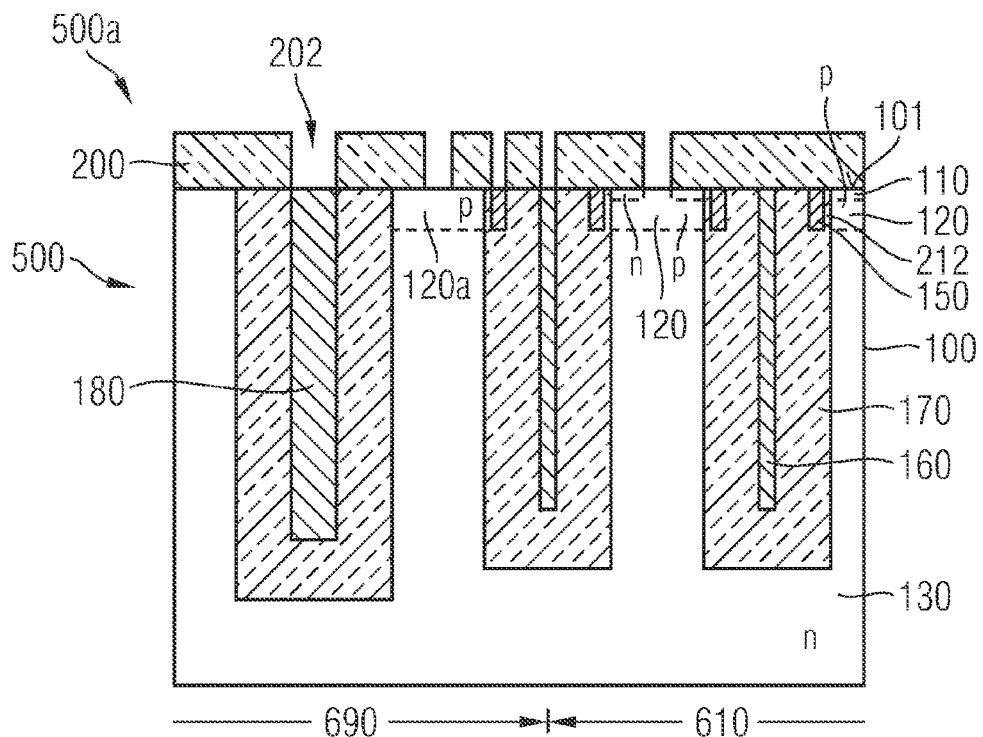
FIG. 3B is a schematic cross-sectional view of the semiconductor substrate of FIG. 3A after providing openings in a dielectric layer adjoining the semiconductor die.

FIG. 3B shows a dielectric layer 200 formed directly on the first surface 101 from the provided dielectric material(s). The dielectric layer 200 may be patterned in total by photolithographic means such that openings 202 in the dielectric layer 200 expose at least the body zones 120 in the cell areas 610. According to other embodiments one or more of the body wells 120a, field electrodes 160, 180 are exposed in the edge areas 690.

An impurity source is brought into contact with at least the exposed sections of the body zones 120. According to an embodiment, a platinum containing layer is deposited and tempered such that the platinum contained in the platinum containing layer reacts with the silicon material of the semiconductor die 100 to form, as a platinum source, layered platinum silicide structures 700 on exposed surfaces of the semiconductor dies 100 through tempering at a temperature between 450 and 500 degree Celsius, for example at about 470 degree Celsius. According to other embodiments, the impurity source is a solution containing the metallic recombination element or an implant region resulting from implanting the metallic recombination element into the body zones 120.

Figure 3C:
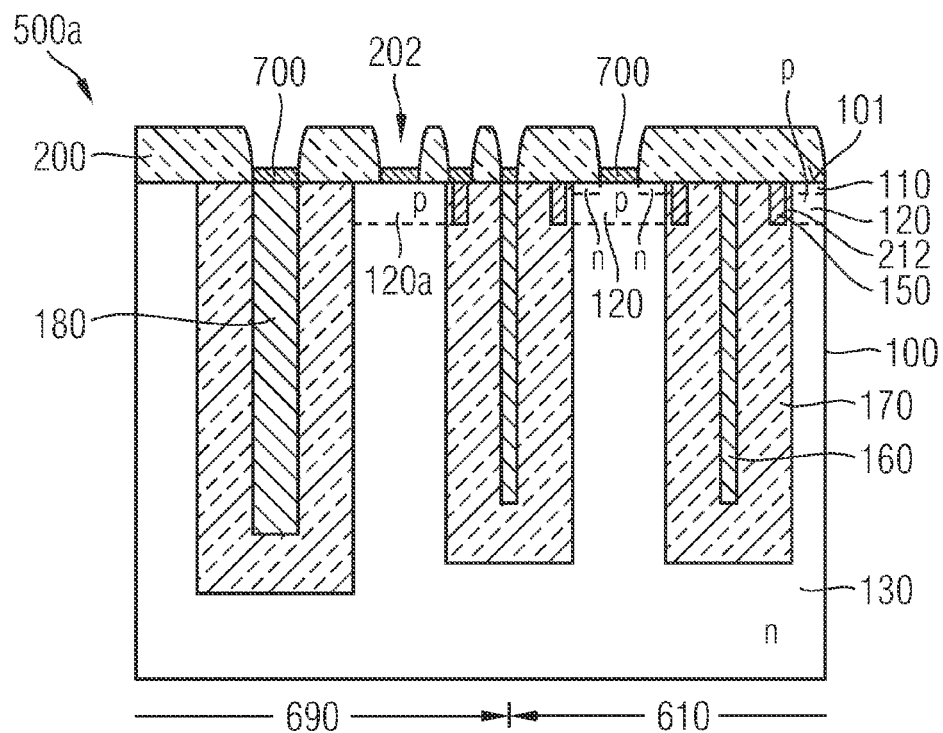
FIG. 3C is a schematic cross-sectional view of the semiconductor substrate of FIG. 3B after providing a platinum source on exposed sections of the first surface.

FIG. 3C shows the platinum silicide structures 700 formed on exposed sections of the first surface 101. In the exposed sections the body zones 120 directly adjoin the first surface 101. Platinum silicide structures 700 may be also formed on exposed surfaces of, for example, the field electrode 180 and further gate electrodes assigned to an edge area 169. The semiconductor substrate 500a is tempered at a temperature of at least 750 degree Celsius, for example in a range from 850 to 900 degree Celsius, for example at 880 degree Celsius such that platinum atoms or ions diffuse from the platinum silicide structures 700 into the semiconductor die 100.

After the tempering for controlling the diffusion of platinum Pt atoms, impurities of the second conductivity type 724 are introduced through the openings 212 of the dielectric layer 200 to form body contact zones 121 having a higher dopant concentration than the body zones 120. For example, the net dopant concentration in the body contact zones 121 may be at least ten times higher than the net dopant concentration in the body zones 120.

Figure 3D:
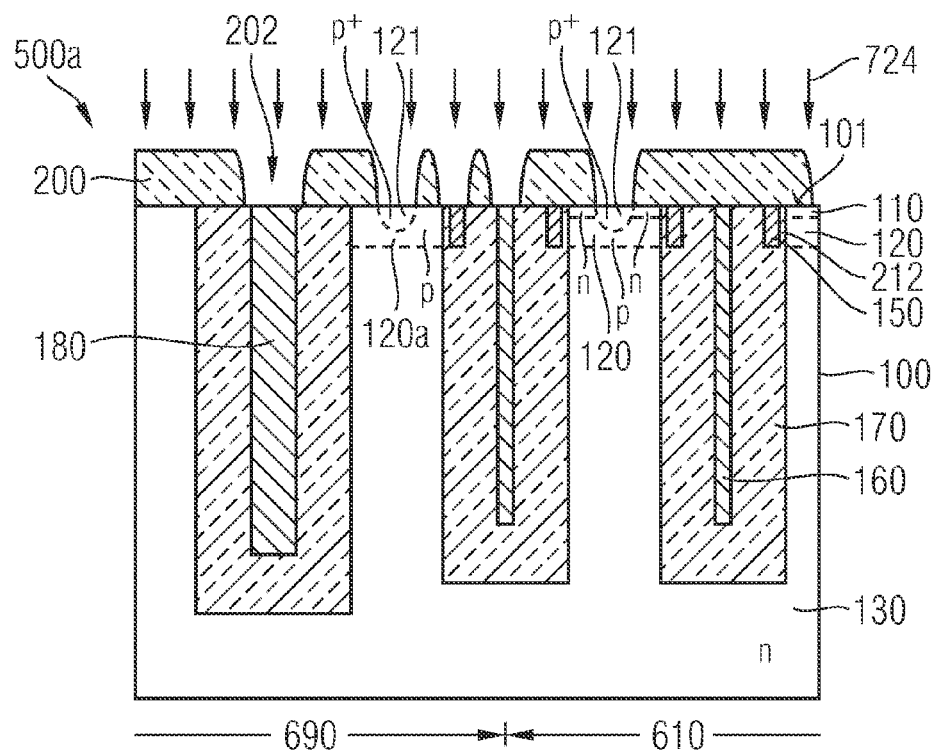
FIG. 3D is a schematic cross-sectional view of the semiconductor substrate of FIG. 3C during formation of body contact zones.

As shown in FIG. 3D the openings 202 in the dielectric layer 200 may be rounded as a result of the temper process performed for diffusing out the platinum atoms. The body contact zones 121 provide a low-ohmic contact to the body zones 120. While according to the illustrated embodiment impurities of the second conductivity type 724 are also introduced into the gate electrodes 150 and field electrodes 180 in the edge area, other embodiments may provide an impurity mask that shields one, more or all of the field electrodes 160, 180 and the gate electrodes 150 against the impurities of the second conductivity type 724. The impurities of the second conductivity type 724 may be introduced by out diffusion from the gaseous phase or by an implant process, by way of example. The exposed sections of the semiconductor die 100 between neighboring gate trench structures form first sections of the first surface 101 which are flush with further sections of the first surface 101. Outside the gate trench structures, the first surface 101 is approximately planar in the cell area 610. The openings 202 may be widened up by an isotropic etch such that sections of the source zones 110 directly adjoining the body contact zones 121 are exposed. For example, the dielectric layer 200 may be wet etched.

A metal may be deposited and tempered to form metal silicide 310 for interfacing at least the body contact zones 121 and the source zones 110. A titanium nitride layer may be provided to contact the gate electrodes 150. A further metal, for example tungsten W may be deposited to provide metal plugs 320 filling the openings in the dielectric layer 200. A first metal layer 410 may be deposited on the surface of the metal plugs 320.

Figure 3E:
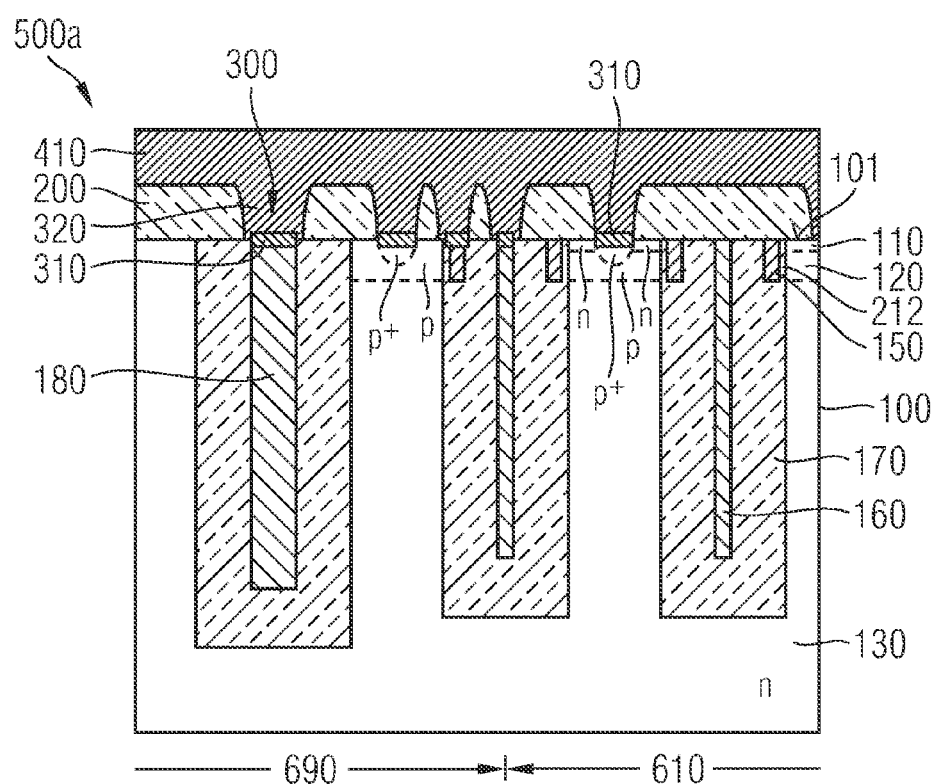
FIG. 3E is a schematic cross-sectional view of the semiconductor device of FIG. 3D after providing metal plugs and a first metal layer.

FIG. 3E shows contact plugs 300 including metal silicide 310 at least at the interface between the metal plugs 320 and the source zones 110 and the body contact zones 121. The contact plugs 300 end on the first surface 101 of the semiconductor die 100.

Figure 4A:
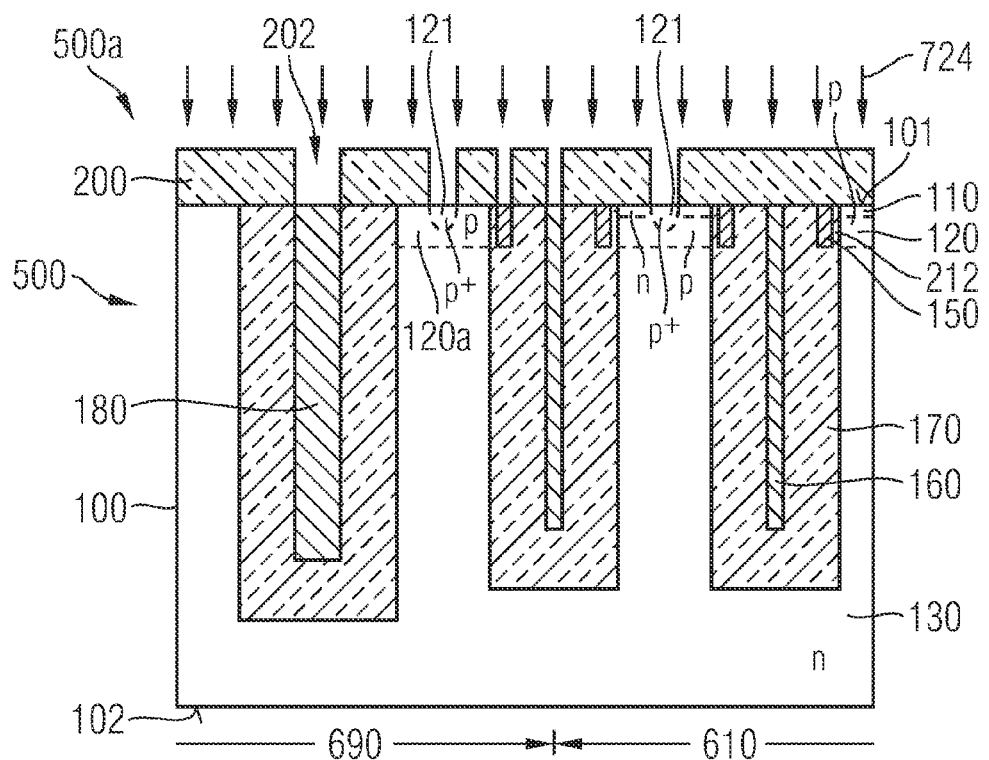
FIG. 4A is a schematic cross-sectional view of a semiconductor substrate during manufacturing of a semiconductor device in accordance with an embodiment bringing a platinum source into contact with polysilicon plugs during formation of body contact zones.
Figure 4B:
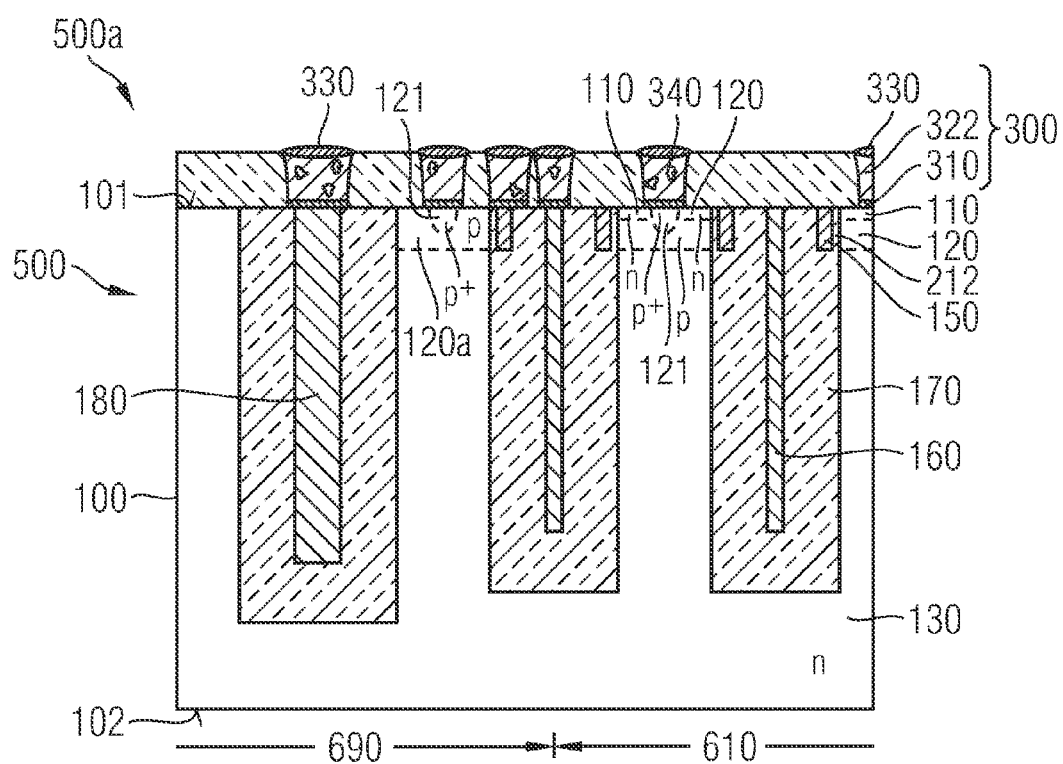
FIG. 4B is a cross-sectional view of the semiconductor substrate of FIG. 4A after providing platinum containing structures on exposed surfaces of polysilicon plugs electrically contacting the body contact zones.

FIGS. 4A and 4B refer to an embodiment providing contact plugs 300 with polysilicon plugs 322 instead of metal plugs 320. A semiconductor substrate 500a may be processed as shown in FIG. 1A to 1I to provide a dielectric layer 200 with openings 202. The openings 202 expose at least body zones 120 in cell areas 610 of the semiconductor dies 100 of the semiconductor substrate 500a. According to other embodiments, in edge areas 690, one or more of body wells 120a, field electrodes 160, 180 may be exposed. The dielectric layer 200 is effective as an impurity mask when introducing impurities of the second conductivity type 724 into the body wells 120a and into the body zones 120 to form highly doped body contact zones 121.

FIG. 4A shows the body contact zones 121 providing a low-ohmic contact between the body zones 120 and contact plugs 300 provided later. While according to the illustrated embodiment impurities of the second conductivity type 724 are also introduced into the gate electrodes 150 and field electrodes 180 in the edge area, other embodiments may provide an impurity mask that shields one, more or all of the field electrodes 160, 180 and the gate electrodes 150 against the impurities of the second conductivity type 724. The impurities of the second conductivity type 724 may be introduced by out diffusion from the gaseous phase or by an implant process, by way of example.

A metal silicide 310, for example titanium silicide, tantalum silicide or tungsten silicide may be formed on portions of the semiconductor die 100 and on further conductive structures exposed by the openings 202 in the dielectric layer 200. Polycrystalline silicon may be deposited to form polysilicon plugs 322 filling the openings 202. According to an embodiment the polysilicon plugs 322 are in-situ doped during deposition of the polycrystalline silicon material. In accordance with other embodiments, the polysilicon plugs 322 are provided from an intrinsic polycrystalline silicon material. A platinum layer may be deposited and annealed to form platinum containing structures 330 on the exposed surfaces of the polysilicon plugs 322.

FIG. 4B shows contact plugs 300 with the platinum containing structures 330 formed on polysilicon plugs 322 extending through the dielectric layer 200. Metal silicide 310 extends along the interfaces between the polysilicon plugs 322 and the semiconductor die 100. The semiconductor substrate 500a may be tempered at temperatures of at least 750 degree Celsius to diffuse platinum Pt atoms out from the platinum containing structures 330 into the semiconductor die 100 to reduce the reverse recovery charge. Within the polysilicon plugs 322, the diffused platinum atoms form platinum silicide crystallites 340. In case of providing polysilicon plugs 322 from initially intrinsic polycrystalline silicon material, the polycrystalline plugs 322 may be doped with n-type or p-type impurities after the tempering.

FIG. 5 illustrates a semiconductor device 500 which may result, by way of example from the method as described with reference to FIGS. 4A to 4B. FIG. 5 includes all elements of FIG. 4B. In addition, FIG. 5 shows a first metal layer 410 electrically connected to the source zones 110 and the body zones 120 in the cell area 610 through contact plugs 300. According to some embodiments, the first metal layer 410 is also electrically connected to the body wells 120a and further conductive structures in the edge area 690. The contact plugs 300 include platinum silicide crystallites 340 resulting from the out diffusion of platinum atoms from a platinum containing structure provided at a distance to the first surface 101.

The doped layer 130 may include a highly doped substrate layer 136 and a low-doped drift layer 139. A second metal layer 420 may directly contact the substrate layer 136. The first and second metal layers 410, 420 may consist of or contain, as main constituent(s), aluminum Al, copper Cu or alloys of aluminum or copper, for example AlSi, AlCu, or AlSiCu. According to other embodiments, the first and/or second metal layer 410, 420 may contain, as main constituent(s) nickel Ni, titanium Ti, silver Ag, gold Au, platinum Pt and/or palladium Pd. Each of the first and second metal layers 410, 420 may include two or more sub-layers of the mentioned composition.

Platinum silicide is not formed directly on the monocrystalline semiconductor die 100 such that platinum silicide is neither formed close to the channel region nor in the contact regions of the source zones 110 and the body zones 120. As a result, the on-state characteristics of the semiconductor device 500 cannot be adversely affected by platinum silicide. On the other hand, platinum atoms diffused out from the platinum containing structure 330 provided at a distance to the semiconductor die 100 effectively reduce reverse recovery charge. Other embodiments provide vanadium V, iridium Ir, palladium Pd or gold Au instead of or in addition to platinum Pt.

Figure 6:
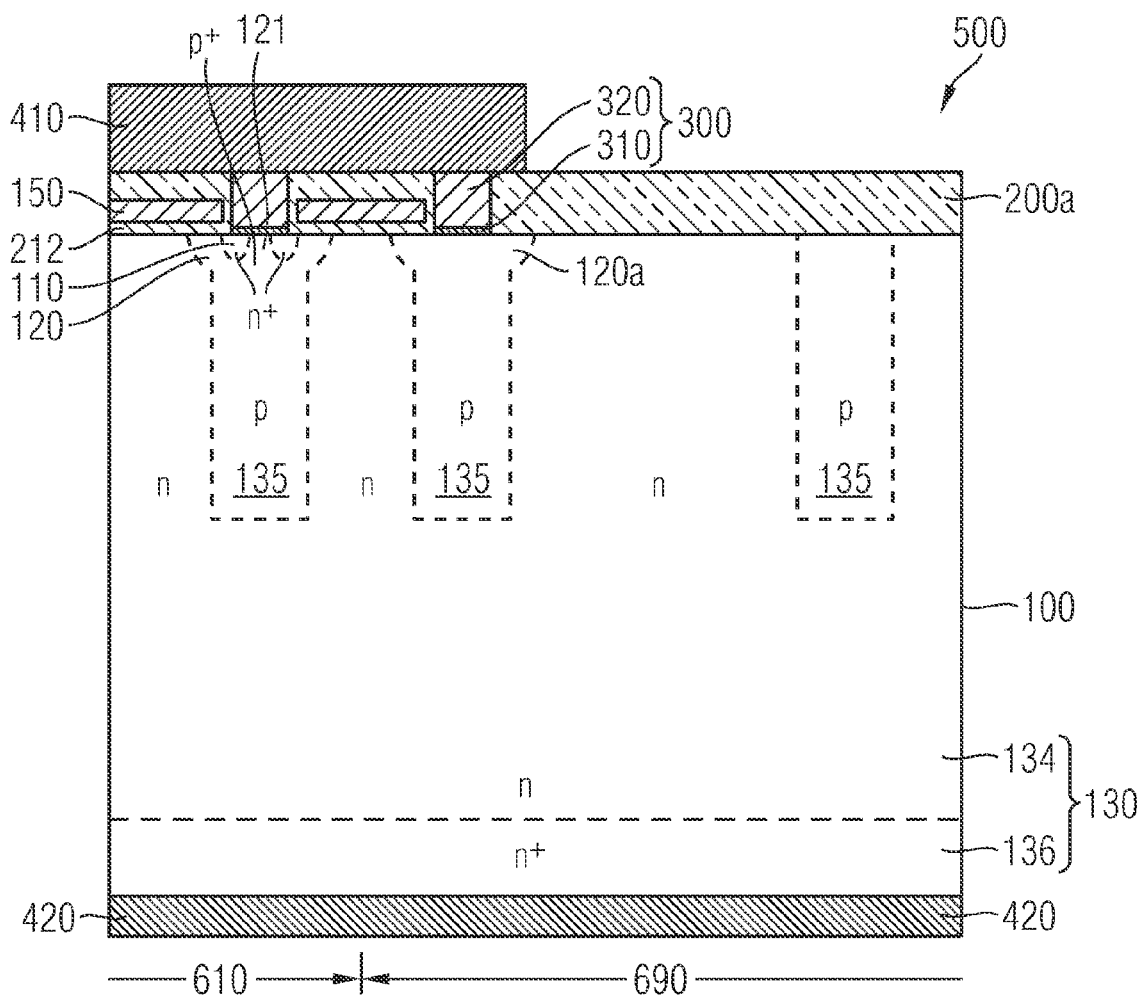
FIG. 6 is a schematic cross-sectional view of a portion of a semiconductor device in accordance with an embodiment related to super-junction devices with metal plugs.

FIG. 6 refers to an embodiment related to a super-junction semiconductor device 500. In a cell area 610 of a semiconductor die 100, columnar structures extending in a vertical direction orthogonal to the first and second surfaces 101, 102 of the semiconductor die 100 are alternately arranged. For example, in the case of an n-FET, a high impurity concentration in the n-doped columns results in a low on-state resistance of the semiconductor device 500. On the other hand, when a reverse voltage is applied, depletion zones extend between the n-doped columns and the p-doped columns 135 in a lateral direction parallel to the first and second surfaces 101, 102 such that a high reverse breakdown voltage can be achieved despite the high impurity concentration in the n-doped columns.

According to the illustrated embodiment referring to n-FETs, p-doped body wells 120a may be formed as vertical extensions or as portions of the p-type columns 135 and adjoin the first surface 101. The source zones 110 may be formed as wells within body wells 120a. Remaining sections of the body wells 120a form the body zones 120. Gate electrodes 150 are disposed outside the semiconductor die 100 at a distance to the first surface 101. Gate dielectrics 212 separate the gate electrodes 150 from the semiconductor die 100 and the body zones 120 formed within the semiconductor die 100. A dielectric structure 200a insulates the gate electrodes 150 from a first metal layer 410 and from contact plugs 300 electrically connecting the first metal layer 410 with the body zones 120 and the source zones 110 in the semiconductor die 100. A second metal layer 420 directly contacts a substrate layer 136 of the doped layer 130.

The contact plugs 300 may include metal silicide 310 at the interface to the semiconductor die 100, a polysilicon plug 322 and platinum silicide crystallites 340 resulting from the out diffusion of platinum atoms from a platinum containing structure provided at a distance to the semiconductor die 100.

Figure 7A:
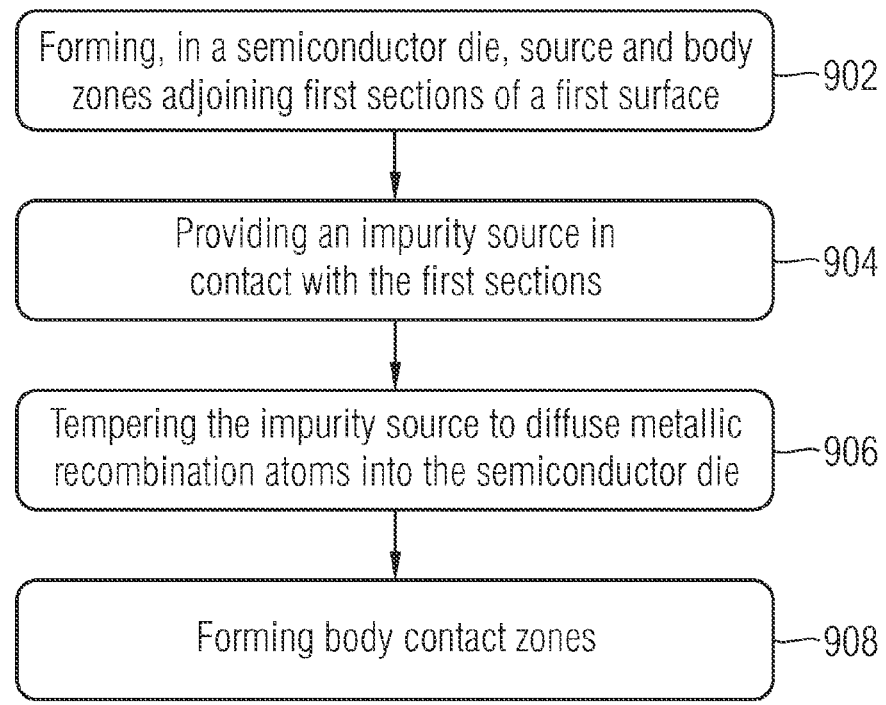
FIG. 7A is a simplified flow-chart of a method of manufacturing a semiconductor device according to an embodiment related to metal plugs.

FIG. 7A refers to a method of manufacturing a semiconductor device. Source zones of a first conductivity type and body zones of a second conductivity type, which is the opposite of the first conductivity type, are formed in a semiconductor die (902). The source and body zones adjoin a first surface of the semiconductor die in first sections. An impurity source is provided in contact with the first sections of the first surface (904). The impurity source is tempered so that atoms of a metallic recombination element diffuse out from the impurity source into the semiconductor die (906). After the tempering, impurities of the second conductivity type are introduced into the semiconductor die to form body contact zones between two neighboring source zones, respectively (908). The body contact zones have a net dopant concentration at least ten times higher than the body zones.

Figure 7B:
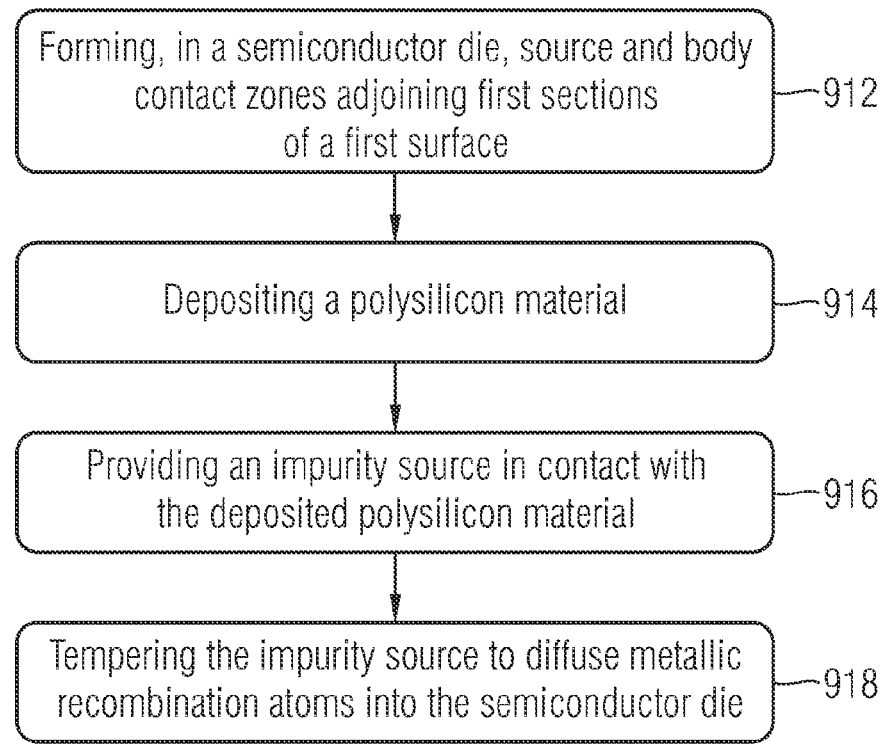
FIG. 7B is a simplified flow-chart of a method of manufacturing a semiconductor device according to an embodiment related to polysilicon plugs.

According to the embodiment of FIG. 7B, source zones of a first conductivity type and body contact zones of a second conductivity type, which is the opposite of the first conductivity type, are formed in a semiconductor die (912). The source and body contact zones adjoin a first surface of the semiconductor die in first sections. A semiconductor material is deposited to form polysilicon plugs extending through openings in a dielectric layer that adjoins the first surface (914). The polysilicon plugs are electrically connected to the source and body contact zones. An impurity source is provided in contact with the deposited semiconductor material (916). The impurity source is tempered (918). Atoms of a metallic recombination element diffuse out from the impurity source into the semiconductor die and form silicide crystallites in the polysilicon plugs at a distance to the first surface.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
    forming source zones of a first conductivity type and body zones of a second conductivity type, which is the opposite of the first conductivity type, in a semiconductor die, the source and body zones adjoining a first surface of the semiconductor die in first sections;
    providing an impurity source in contact with the first sections of the first surface;
    tempering the impurity source so that atoms of a metallic recombination element diffuse out from the impurity source into the semiconductor die; and
    introducing, after the tempering, impurities of the second conductivity type into the semiconductor die to form body contact zones between two neighboring source zones, respectively, the body contact zones having a net dopant concentration at least ten times higher than the body zones.

2. The method of claim 1, wherein the metallic recombination element is selected from a group comprising platinum, palladium, vanadium, iridium and gold.

3. The method of claim 1, wherein the metallic recombination element is platinum and the impurity source is a platinum source.

4. The method of claim 3, wherein providing the platinum source comprises bringing a platinum containing solution in contact with the first sections of the first surface.

5. The method of claim 3, wherein providing the platinum source comprises providing a platinum containing layer.

6. The method of claim 5, wherein providing the platinum containing layer comprises depositing less than five atomic or molecular layers of platinum.

7. The method of claim 3, wherein providing the platinum source comprises implanting platinum atoms or ions through the first sections of the first surface.

8. The method of claim 3, wherein providing the platinum source comprises depositing a platinum layer and tempering the platinum layer to form layered platinum silicide structures on the first sections of the first surface.

9. The method of claim 8, further comprising removing, after tempering the platinum layer, remnant portions of the platinum layer not incorporated in the layered platinum silicide structures.

10. The method of claim 8, further comprising removing the layered platinum silicide structures after tempering the platinum source.

11. The method of claim 1, further comprising etching contact trenches between neighboring source zones before providing the impurity source.

12. The method of claim 1, further comprising providing gate trench structures extending from the first surface into the semiconductor die, the gate trench structures comprising, in a cell area of the semiconductor die, gate electrodes and gate dielectrics between the gate electrodes and the semiconductor die.

13. A method of manufacturing a semiconductor device, the method comprising:
    forming source zones of a first conductivity type and body contact zones of a second conductivity type, which is the opposite of the first conductivity type, in a semiconductor die, the source and body contact zones adjoining a first surface of the semiconductor die in first sections;
    depositing polycrystalline silicon to form polysilicon plugs extending through openings in a dielectric layer adjoining the first surface, the polysilicon plugs being electrically connected to the source and body contact zones;
    providing an impurity source in contact with the deposited polycrystalline silicon; and
    tempering the impurity source so that atoms of a metallic recombination element diffuse out from the impurity source into the semiconductor die and silicide crystallites are formed in the polysilicon plugs at a distance to the first surface.

14. The method of claim 13, wherein the metallic recombination element is selected from a group comprising platinum, palladium, vanadium, iridium and gold.

15. The method of claim 13, wherein the metallic recombination element is platinum and the impurity source is a platinum source.

16. The method of claim 15, wherein providing the platinum source comprises depositing less than five atomic or molecular layers of platinum on the deposited polycrystalline silicon.

17. The method of claim 15, wherein providing the platinum source comprises implanting platinum atoms or ions into the deposited polycrystalline silicon.

18. The method of claim 15, wherein providing the platinum source comprises depositing a platinum layer on the deposited polycrystalline silicon and tempering the platinum layer to form layered platinum silicide structures on the deposited polycrystalline silicon.

19. The method of claim 18, further comprising removing the layered platinum silicide structures after tempering.

20. The method of claim 13, wherein providing the source and body contact zones comprises:
  forming body wells in the semiconductor die, the body wells adjoining the first surface;
  forming, in each of the body wells of a cell area, two source zones separated from each other, remnant portions of the body wells forming body zones having an extension portion directly adjoining the first surface, respectively; and
  forming the body contact zones in the extension portions, wherein in the body contact zones a doping concentration of the second conductivity type is at least ten times higher than in the body zones.

21. The method of claim 20, wherein forming the source zones comprises providing an impurity mask shielding portions of the body wells assigned to the extension portions to inhibit impurities of the first conductivity type from impinging into the extension portions.

22. A semiconductor device, comprising:
  a field effect transistor structure comprising source zones of a first conductivity type and body contact zones of a second conductivity type which is the opposite of the first conductivity type, the source zones and the body contact zones adjoining first sections of a first surface of a semiconductor die containing atoms of a metallic recombination element, the body contact zones formed between two neighboring source zones and being connected with a body zone formed at a distance to the first surface, respectively; and
  wherein a maximum dopant concentration in the body contact zones is at least $10^{19}$ cm$^{-3}$.

23. The semiconductor device of claim 22, wherein the first sections are flush with the first surface and the body contact zones separate two neighboring source zones.

24. The semiconductor device of claim 22, wherein between neighboring source zones contact trenches extend from the first surface into the semiconductor die, the contact trenches being filled with a conductive material.

25. The semiconductor device of claim 22, further comprising:
  a dielectric layer adjoining the first surface; and
  polysilicon plugs extending through openings in the dielectric layer and directly adjoining the source and body contact zones, the polysilicon plugs comprising silicide crystallites in a portion distant to the first surface.

* * * * *

UNITED STATES PATENT AND TRADEMARK OFFICE
CERTIFICATE OF CORRECTION

PATENT NO.         : 8,558,308 B1                                     Page 1 of 1
APPLICATION NO.    : 13/517658
DATED              : October 15, 2013
INVENTOR(S)        : O. Blank et al.

It is certified that error appears in the above-identified patent and that said Letters Patent is hereby corrected as shown below:

On the Title Page, Item (54) Title of the Invention, and in the Specification, Col. 1, lines 1-5, please change "METHOD OF MANUFACTURING A SEMICONDUCTOR DEVICE USING A CONTACT IMPLANT AND A METALLIC RECOMBINATION ELEMENT AND SEMICONDUCTOR" to -- METHOD OF MANUFACTURING A SEMICONDUCTOR DEVICE USING A CONTACT IMPLANT AND A METALLIC RECOMBINATION ELEMENT AND SEMICONDUCTOR DEVICE --

Signed and Sealed this
Twentieth Day of May, 2014

Michelle K. Lee
*Deputy Director of the United States Patent and Trademark Office*